US012336388B2

(12) United States Patent
Lee et al.

(10) Patent No.: US 12,336,388 B2
(45) Date of Patent: Jun. 17, 2025

(54) THIN FILM TRANSISTOR, METHOD FOR FABRICATING THE THIN FILM TRANSISTOR, THIN FILM TRANSISTOR ARRAY SUBSTRATE, AND METHOD FOR FABRICATING THE THIN FILM TRANSISTOR ARRAY SUBSTRATE

(71) Applicant: Samsung Display Co., LTD., Yongin-si (KR)

(72) Inventors: Jong Chan Lee, Suwon-si (KR); Jung Eun Hong, Seoul (KR); Jin Taek Kim, Yongin-si (KR); Hyun Kim, Seoul (KR); Jeong Su Park, Asan-si (KR); Woong Hee Jeong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 380 days.

(21) Appl. No.: 17/854,584

(22) Filed: Jun. 30, 2022

(65) Prior Publication Data
US 2023/0133550 A1    May 4, 2023

(30) Foreign Application Priority Data
Nov. 3, 2021    (KR) .......................... 10-2021-0149723

(51) Int. Cl.
*H10K 59/121*    (2023.01)
*H10D 30/67*    (2025.01)
(Continued)

(52) U.S. Cl.
CPC ..... *H10K 59/1213* (2023.02); *H10K 59/1216* (2023.02); *H10K 59/126* (2023.02);
(Continued)

(58) Field of Classification Search
CPC ............. H10K 59/1213; H10K 59/131; H10K 59/126; H10K 59/1216; H10K 59/1201;
(Continued)

(56) References Cited

U.S. PATENT DOCUMENTS 6,362,027 B1 *   3/2002   Yamazaki ............ H10D 30/673
                                                              438/149
12,009,372 B2    6/2024   Park et al.
(Continued)

FOREIGN PATENT DOCUMENTS

KR    10-2020-0119119    10/2020
KR    10-2021-0091364    7/2021

*Primary Examiner* — Timor Karimy
(74) *Attorney, Agent, or Firm* — KILE PARK REED & HOUTTEMAN PLLC

(57)    ABSTRACT

A method for fabricating a thin film transistor comprises disposing a semiconductor layer including a channel area, and a first and second electrode areas, disposing a gate insulating layer covering the semiconductor layer, disposing a diffusion barrier layer covering the gate insulating layer, disposing first and second electrode holes corresponding to the first and second electrode areas, and disposing a gate electrode overlapping the channel area, first and second electrodes electrically connected to the first and second electrode areas through the first and second electrode holes. The disposing of the first electrode hole, and the second electrode hole includes patterning the diffusion layer with a patterning mask disposed on the diffusion barrier layer. The disposing of the gate electrode and the first and second electrodes may include disposing a conductive material layer covering the diffusion barrier layer, and patterning the conductive material layer.

21 Claims, 23 Drawing Sheets

(51) Int. Cl.
  *H10D 86/60*    (2025.01)
  *H10K 59/126*   (2023.01)
  *H10K 59/131*   (2023.01)
  *H10K 71/00*    (2023.01)
  *H10D 86/40*        (2025.01)
  *H10K 59/12*        (2023.01)

(52) U.S. Cl.
  CPC ........... *H10K 59/131* (2023.02); *H10K 71/00* (2023.02); *H10D 30/6723* (2025.01); *H10D 30/6755* (2025.01); *H10D 86/423* (2025.01); *H10D 86/441* (2025.01); *H10D 86/481* (2025.01); *H10D 86/60* (2025.01); *H10K 59/1201* (2023.02)

(58) Field of Classification Search
  CPC ............... H10K 71/00; H10D 30/6723; H10D 30/6755; H10D 86/441; H10D 86/423; H10D 86/60; H10D 86/481
  See application file for complete search history.

(56) References Cited

U.S. PATENT DOCUMENTS

| | | | |
|---|---|---|---|
| 2009/0298268 A1 | 12/2009 | Kwon et al. | |
| 2016/0254368 A1* | 9/2016 | Jiang .................... | H10D 64/667 257/72 |
| 2017/0104089 A1 | 4/2017 | Koezuka et al. | |

\* cited by examiner

THIN FILM TRANSISTOR, METHOD FOR FABRICATING THE THIN FILM TRANSISTOR, THIN FILM TRANSISTOR ARRAY SUBSTRATE, AND METHOD FOR FABRICATING THE THIN FILM TRANSISTOR ARRAY SUBSTRATE

CROSS-REFERENCE TO RELATED APPLICATION(S)

This application claims priority to and benefits of Korean Patent Application No. 10-2021-0149723 under 35 U.S.C. § 119, filed on Nov. 3, 2021, in the Korean Intellectual Property Office, the entire contents of which are incorporated herein by reference.

BACKGROUND

1. Technical Field

The disclosure relates to a thin film transistor, a method for fabricating the thin film transistor, a thin film transistor array substrate, and a method for fabricating the thin film transistor array substrate.

2. Description of the Related Art

With the advancement of the information age, the demand for display devices for displaying an image has increased in many different forms. For example, display devices have been applied to various electronic devices such as smart phones, digital cameras, laptop computers, navigators, and smart televisions.

The display device may include a display panel for emitting light for an image display, and a driver for supplying signals and voltages for driving the display panel.

The display panel may include a pair of substrates facing each other, and a polarizing member or a light emitting member, which is disposed between the pair of substrates.

Any of the pair of substrates included in the display panel may be a thin film transistor array substrate that includes thin film transistors for individually driving pixel areas arranged in a display area for implementing an image display.

The thin film transistor array substrate may include thin film transistors as switching elements turned on by a driving signal of a threshold voltage or more.

The thin film transistor includes a semiconductor layer that generates a channel by a driving signal that has a voltage that equals or exceeds a threshold voltage supplied to a gate electrode.

The semiconductor layer may be made of an oxide semiconductor. The semiconductor layer may be unnecessarily conductorized by a doping material such as hydrogen and fluorine, which are contained in the insulating layer, the etching material or a mask material. Therefore, a threshold voltage characteristics of the thin film transistors may vary. Because of the variance in the threshold voltages, the variances in luminance characteristics between the pixel areas may increase, and the display quality of the display device may be deteriorated.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a thin film transistor capable of preventing a channel area of a semiconductor layer from being unnecessarily conductorized, a method for fabricating the thin film transistor, a thin film transistor array substrate, and a method for fabricating the thin film transistor array substrate.

The objects of the disclosure are not limited to those mentioned above and additional objects of the disclosure, which are not mentioned herein, will be clearly understood by those skilled in the art from the following description of the disclosure.

According to an embodiment, a method for fabricating a thin film transistor may comprise of disposing a semiconductor layer including a channel area, a first electrode area and a second electrode area, the first electrode area and the second electrode area contacting both sides of the channel area, disposing a gate insulating layer covering the semiconductor layer, disposing a diffusion barrier layer covering the gate insulating layer, disposing a first electrode hole corresponding to a portion of the first electrode area of the semiconductor layer and a second electrode hole corresponding to a portion of the second electrode area of the semiconductor layer, the disposing of the first electrode hole and the second electrode hole including patterning the diffusion barrier layer and the gate insulating layer with a patterning mask disposed on the diffusion barrier layer, and disposing a gate electrode overlapping the channel area of the semiconductor layer, in a plan view, a first electrode electrically connected to the first electrode area of the semiconductor layer through the first electrode hole, and a second electrode electrically connected to the second electrode area of the semiconductor layer through the second electrode hole, the disposing of the gate electrode, the first electrode and the second electrode including disposing a conductive material covering the diffusion barrier layer, and patterning the conductive material layer.

The semiconductor layer is made of an oxide semiconductor.

The diffusion barrier layer is made of titanium (Ti).

The patterning of the diffusion barrier layer and the gate insulating layer may use an etching material that includes a doping material. The disposing of the first electrode hole and the second electrode hole may include conductorizing a portion of the first electrode area of the semiconductor layer, which is exposed by the first electrode hole using the doping material of the etching material, and conductorizing a portion of the second electrode area of the semiconductor layer, which is exposed by the second electrode hole, using the doping material of the etching material.

The disposing of the first electrode hole and the second electrode hole may include, shielding with the diffusion barrier layer a remainder of the semiconductor layer from a doping material included in the mask material comprising the patterning mask. The remainder of the semiconductor layer being a portion of the semiconductor layer that excludes the portion of the first electrode area corresponding to the first electrode hole, and the portion of the second electrode area corresponding to the second electrode hole.

The method further comprises annealing to reduce a concentration of hydrogen (H) in the semiconductor layer and the gate insulating layer after the disposing of the gate insulating layer.

The annealing to reduce the concentration of hydrogen is performed at a temperature in a range of about 300° C. to about 350° C.

The method further comprises, patterning the diffusion barrier layer and the gate insulating layer based on the gate electrode, the first electrode and the second electrode using and etching material. The patterning of the diffusion barrier layer and the gate insulating layer including conductorizing a remainder of the semiconductor layer that overlaps the gate electrode, the first electrode and the second electrode in a plan view.

The method may further comprise disposing a light shielding layer on a substrate, and disposing a buffer layer covering the light shielding layer. In the disposing of the semiconductor layer, the semiconductor layer may be disposed on the buffer layer. The channel area of the semiconductor layer may overlap the light shielding layer in a plan view.

In the disposing of the conductive material layer, the conductive material layer is provided as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

According to an embodiment, a method for fabricating a thin film transistor array substrate may comprise disposing a light shielding layer corresponding to pixel areas of a substrate, disposing a buffer layer covering the light shielding layer on the substrate, disposing a semiconductor layer on the buffer layer, the semiconductor layer corresponding to the pixel areas, the semiconductor layer including a channel area, a first electrode area, and a second electrode area contacting both sides of the channel area, disposing a gate insulating layer covering the semiconductor layer on the buffer layer, disposing a diffusion barrier layer covering the gate insulating layer, disposing a first electrode hole corresponding to a portion of the first electrode area of the semiconductor layer and a second electrode hole corresponding to a portion of the second electrode area of the semiconductor layer, the disposing of the first electrode hole and the second electrode hole including patterning the diffusion barrier layer and the gate insulating layer using a patterning mask disposed on the diffusion barrier layer, and disposing a gate electrode overlapping the channel area of the semiconductor layer, in a plan view, a first electrode electrically connected to the first electrode area of the semiconductor layer through the first electrode hole, and a second electrode electrically connected to the second electrode area of the semiconductor layer through the second electrode hole, the disposing of the gate electrode, the first electrode, and the second electrode including disposing a conductive material layer covering the diffusion barrier layer, and patterning the conductive material layer.

The semiconductor layer may be made of an oxide semiconductor.

The diffusion barrier layer is made of titanium (Ti).

The disposing of the light shielding layer may include disposing data line on the substrate. The buffer layer may cover the data line. The disposing of the first electrode hole and the second electrode hole may include patterning the buffer layer to dispose a line contact hole corresponding to a portion of the data line.

The disposing of the gate electrode, the first electrode and the second electrode may include disposing a scan line that intersects the data line on the diffusion barrier layer. The gate electrode may be comprised of a portion of the scan line. The first electrode may be electrically connected to the data line through the line contact hole.

The patterning of the diffusion barrier layer and the gate insulating layer may use an etching material that includes a doping material. The disposing of the first electrode hole and the second electrode hole may include conductorizing a portion of the first electrode area of the semiconductor layer, which is exposed by the first electrode hole using doping material of the etching material, and conductorizing a portion of the second electrode area of the semiconductor layer, which is exposed by the second electrode hole using doping material of the etching material.

The disposing of the first electrode hole and the second electrode hole may include shielding with the diffusion layer a remainder of the semiconductor layer from a doping material included in a mast material comprising the patterning mask. The remainder of the semiconductor layer may be a portion of the semiconductor layer that excludes the portion of the first electrode area corresponding to the first electrode hole, and the portion of the second electrode area corresponding to the second electrode hole.

The method may further comprise annealing to reduce a concentration of hydrogen (H) in the semiconductor layer and the gate insulating layer after the disposing of the gate insulating layer.

The annealing to reduce the concentration of hydrogen may be performed at a temperature in a range of about 300° C. to about 350° C.

The method may further comprise patterning the diffusion barrier layer and the gate insulating layer based on the gate electrode, the first electrode and the second electrode using an etching material, the patterning of the diffusion barrier layer and the gate insulating layer including conductorizing a remainder of the semiconductor layer using a doping material included in the etching material. The remainder of the semiconductor layer may exclude a portion of the semiconductor layer that overlaps the gate electrode, the first electrode and the second electrode in a plan view.

The patterning of the diffusion barrier layer and the gate insulating layer may include conductorizing a portion of the second electrode area of the semiconductor layer which overlaps the light shielding layer.

According to an embodiment, a thin film transistor may comprise a semiconductor layer including a channel area, a first electrode area and a second electrode area, the first electrode area and the second electrode area contacting both sides of the channel area, a gate insulating layer covering the semiconductor layer, a diffusion barrier layer covering the gate insulating layer, a first electrode hole corresponding to a portion of the first electrode area of the semiconductor layer, the first electrode hole passing through the gate insulating layer and the diffusion barrier layer, a second electrode hole corresponding to a portion of the second electrode area of the semiconductor layer, the second electrode hole passing through the gate insulating layer and the diffusion barrier layer, a gate electrode disposed on the diffusion barrier layer, the gate electrode overlapping the channel area of the semiconductor layer in a plan view, a first electrode disposed on the diffusion barrier layer, the first electrode electrically connected to the first electrode area of the semiconductor layer through the first electrode hole, and a second electrode disposed on the diffusion barrier layer, the second electrode electrically connected to the second electrode area of the semiconductor layer through the second electrode hole.

The semiconductor layer may be made of an oxide semiconductor.

The diffusion barrier layer may be made of titanium (Ti).

The thin film transistor may further comprise an interlayer insulating layer covering the gate electrode, the first electrode and the second electrode.

Each of the gate electrode, the first electrode, and the second electrode is provided as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

According to an embodiment, a thin film transistor array substrate may comprise thin film transistors, each of the thin film transistors corresponding to a pixel area among pixel areas for displaying an image, a scan line electrically connected to at least one of the thin film transistors, the scan line extending in a first direction, and a data line electrically connected to the thin film transistors, the data line extending in a second direction intersecting the first direction. Each of the thin film transistors may include a light shieling layer disposed on a substrate, a semiconductor layer disposed on a buffer layer covering the light shielding layer, the semiconductor layer made of an oxide semiconductor, the semiconductor layer including a channel area, a first electrode area, and a second electrode area, the first electrode area and the second electrode area contacting both sides of the channel area, a gate insulating layer covering the semiconductor layer, a diffusion barrier layer covering the gate insulating layer, a first electrode hole passing through the gate insulating layer and through the diffusion barrier layer, the first electrode hole corresponding to a portion of the first electrode area, a second electrode hole passing through the gate insulating layer and through the diffusion barrier layer, the second electrode hole corresponding to a portion of the second electrode area, a gate electrode disposed on the diffusion barrier layer, the gate electrode overlapping the channel area in a plan view, a first electrode disposed on the diffusion barrier layer, the first electrode electrically connected to the first electrode area through the first electrode hole, and a second electrode disposed on the diffusion barrier layer, the second electrode electrically connected to the second electrode area through the second electrode hole.

The diffusion barrier layer may be made of titanium (Ti).

The thin film transistor array substrate may further comprise an interlayer insulating layer covering the gate electrode, the first electrode and the second electrode.

A remainder of the semiconductor layer may contact the interlayer insulating layer, the remainder excluding a portion of the semiconductor layer that overlaps the gate electrode, the first electrode and the second electrode in a plan view.

The data line may be disposed on the substrate, the scan line may be disposed on the diffusion barrier, and the gate electrode may be comprised of a portion of the scan line.

Each of the thin film transistors may further include a line contact hole passing through the buffer layer, the gate insulating layer and the diffusion barrier layer, the line contact hole corresponding to a portion of the data line. The first electrode may be electrically connected to the data line through the line contact hole.

The thin film transistor array substrate may further comprise storage capacitors, each of the storage capacitors corresponding to a pixel area. Each of the storage capacitors is provided by an overlap area between the second electrode area of the semiconductor layer and the light shielding layer in a plan view.

The method for fabricating a thin film transistor and the method for fabricating a thin film transistor array substrate according to an embodiment of the disclosure include disposing a diffusion barrier layer covering a gate insulating layer before disposing the first and second electrode holes that may connect a first electrode and a second electrode to a semiconductor layer.

The gate insulating layer and the diffusion barrier layer are interposed between a semiconductor layer and a patterning mask used to dispose the first electrode hole and the second electrode hole, the diffusion barrier layer may prevent doping material included in the mask material of the patterning mask from being injected into a channel area of the semiconductor layer. Even when the patterning mask may also be used to dispose the gate electrode and the first and second electrodes before the gate electrode is disposed, conductorization of the channel area of the semiconductor layer due to the injection (or contamination) of the doping material in the patterning mask may be avoided.

Therefore, the number of mask processes may be reduced while at the same time preventing switching reliability of the thin film transistor from being deteriorated, and avoiding variations of threshold voltage characteristics of the thin film transistor.

The thin film transistor array substrate comprised of the thin film transistor may prevent differences in threshold voltage characteristics between the thin film transistors of the pixel areas from increasing. Therefore, differences luminance characteristics between the pixel areas may be prevented from increasing, and thus preventing the display quality of the display device from deteriorating.

The effects according to the embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
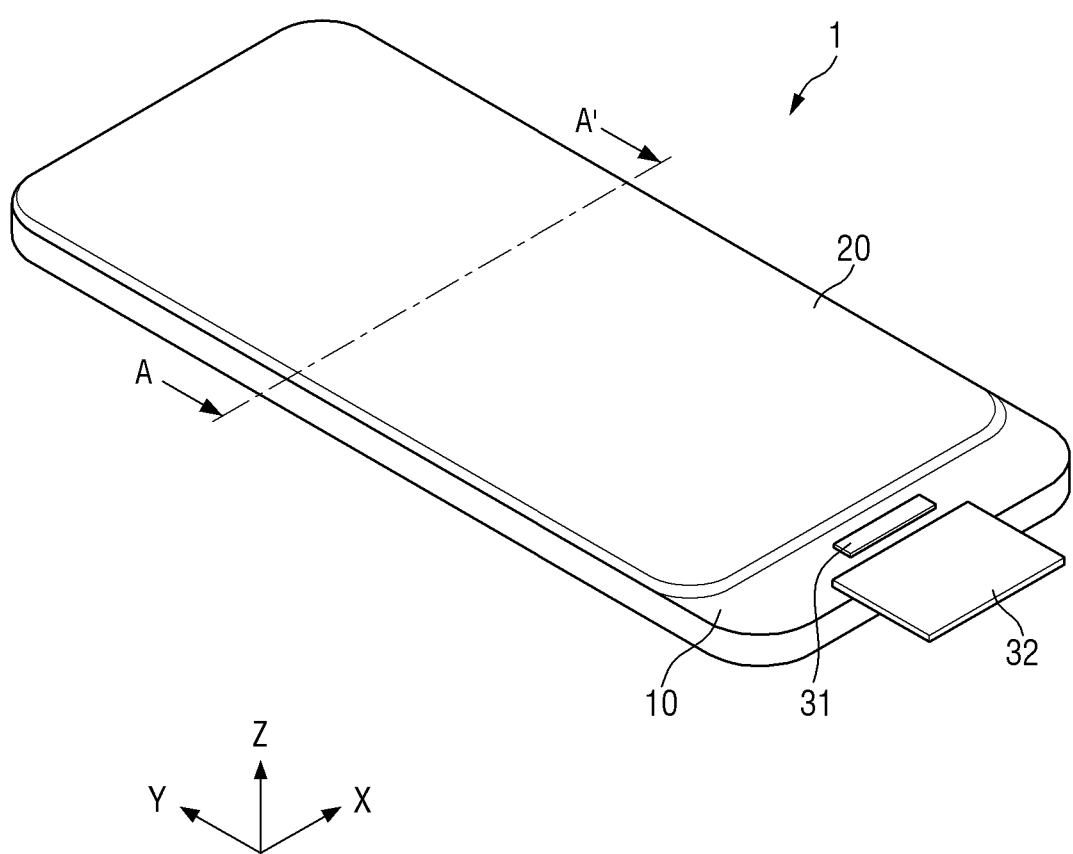
FIG. 1 is a schematic perspective view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In case that a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in case that a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
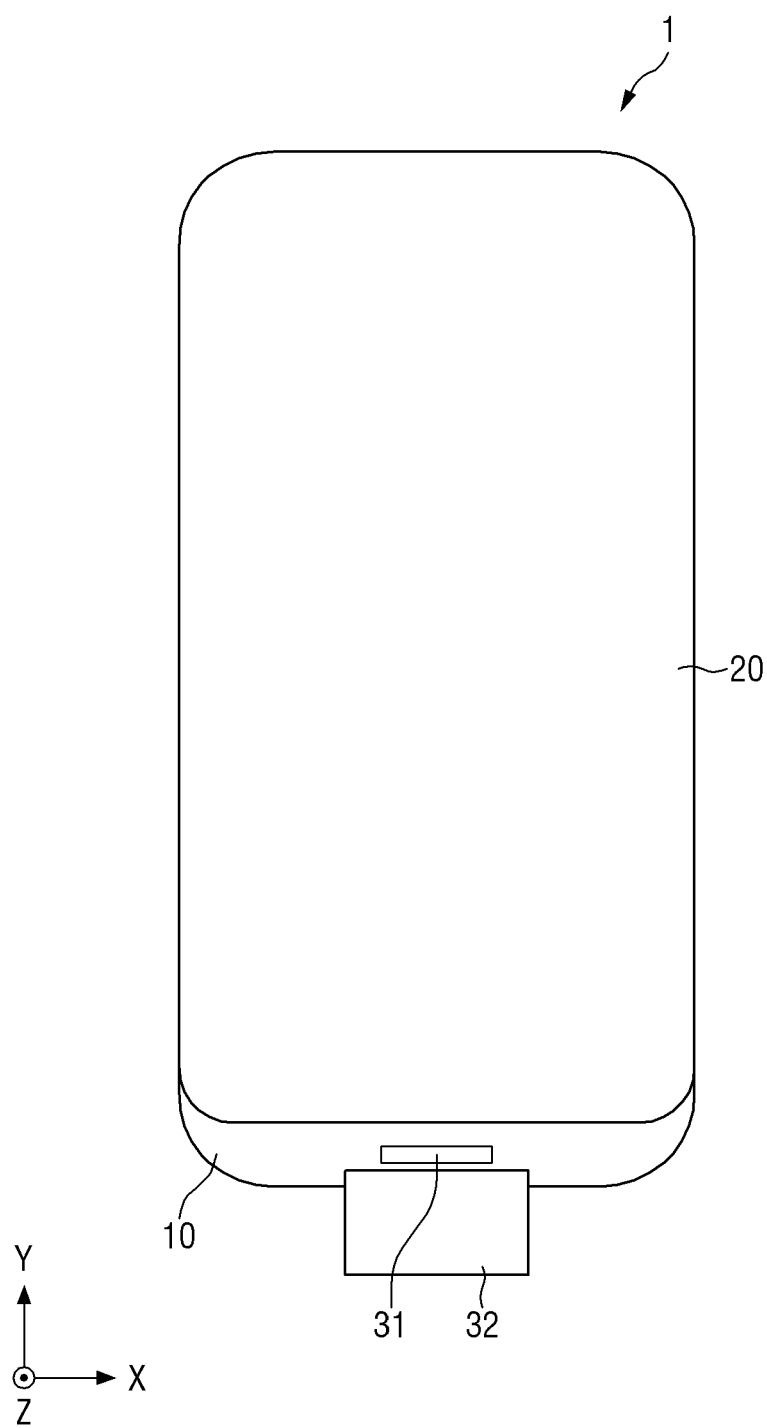
FIG. 2 is a schematic plan view illustrating the display device of FIG. 1.
Figure 3:
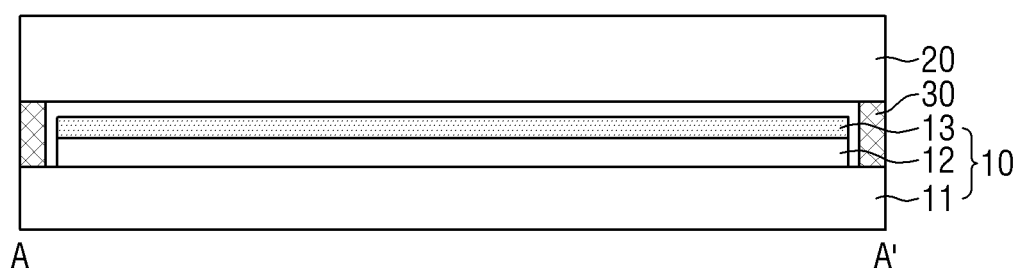
FIG. 3 is a schematic cross-sectional view along line A-A' of FIG. 1.
Figure 4:
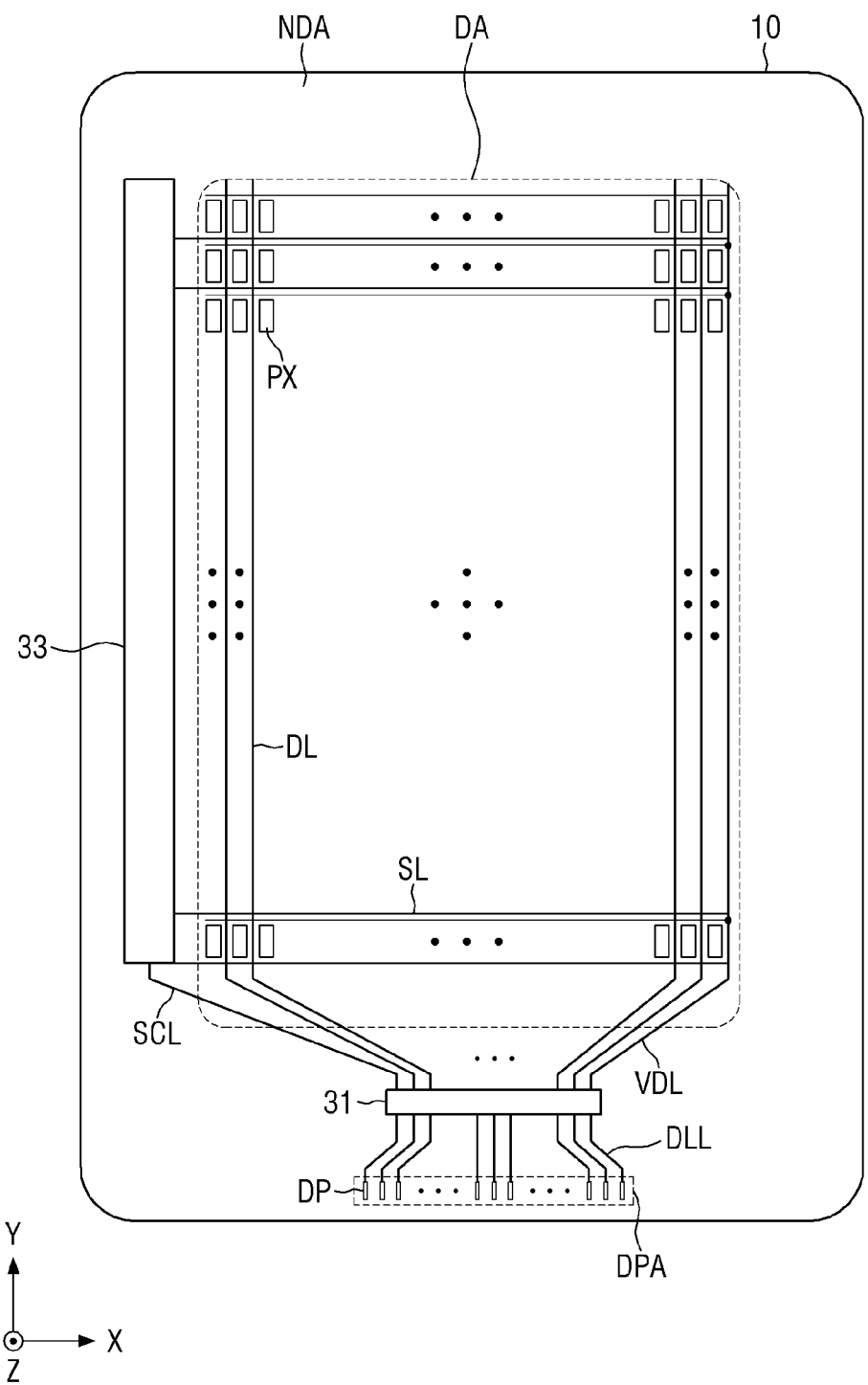
FIG. 4 is a schematic plan view illustrating an example of a thin film transistor array substrate of FIG. 3.

FIG. 1 is a schematic perspective view illustrating a display device according to an embodiment. FIG. 2 is a schematic plan view illustrating the display device of FIG. 1. FIG. 3 is a schematic cross-sectional view along line A-A' of FIG. 1. FIG. 4 is a schematic plan view illustrating an example of a thin film transistor array substrate of FIG. 3.

Referring to FIG. 1, a display device 1 is a device that displays a moving image or a still image. The display device 1 may be used as a display screen in various products such as a television, a laptop computer, a monitor, a billboard, and a device for Internet of things (IoT) as well as portable electronic devices such as a mobile phone, a smart phone, a tablet personal computer (PC), a smart watch, a watch phone, a mobile communication terminal, an electronic diary, an electronic book, a portable multimedia player (PMP), a navigation device, and an ultra-mobile PC (UMPC).

The display device 1 may be a light emitting display device such as an organic light emitting display device using an organic light emitting diode, a quantum dot light emitting display device including a quantum dot light emitting layer, an inorganic light emitting display device including an inorganic semiconductor, and a micro or nano light emitting display device using a micro or nano light emitting diode (micro or nano LED). In the following description, although the display device 1 is an organic light emitting display device, the disclosure is not limited thereto.

Referring to FIGS. 1 and 2, the display device 1 may include a thin film transistor array substrate 10 and a protective substrate 20, which face each other.

The display device 1 may further include a display driving circuit 31 for driving the thin film transistor array substrate 10, and a display circuit board 32.

Although not shown in FIG. 1, the display device 1 may further include a light emitting material or a polarizing material (not shown), which is embedded in the thin film transistor array substrate 10 or disposed between the thin film transistor array substrate 10 and the protective substrate 20.

The display device 1 may further include an encapsulation structure for sealing the light emitting material or the polarizing material, which is disposed between the thin film transistor array substrate 10 and the protective substrate 20.

The thin film transistor array substrate 10 individually drives a light emitting material or polarizing material corresponding to pixel areas arranged in a display area, thereby emitting light of the pixel areas having their respective luminance or colors to the outside through the thin film transistor array substrate 10 or the protective substrate 20. As a result, the display device 1 may provide an image display function.

The display device 1 may further include a touch sensing unit (not shown) for detecting coordinates of a point touched by a user in a display surface to which a light for displaying an image is emitted.

The touch sensing unit may be attached to a surface of the protective substrate 20, or may be embedded between the thin film transistor array substrate 10 and the protective substrate 20.

The touch sensing unit may include a touch electrode (not shown) arranged in a touch sensing area corresponding to the display surface and made of a transparent conductive material.

The touch sensing unit may detect a change in a capacitance value of the touch electrode periodically in a state that a touch driving signal is applied to the touch electrode, thereby detecting whether a touch input is made and coordinates of a point where the touch input is made.

The display surface of the display device 1 may be a rectangular shape having a short side of a first direction (X-axis direction) and a long side of a second direction (Y-axis direction) intersecting the first direction (X-axis direction), but this is only an example, and the display surface of the display device 1 may be implemented in various forms.

For example, the display surface may be rounded to have a curvature at a corner where a short side of the first direction (X-axis direction) and a long side of the second direction (Y-axis direction) meet. In other examples, the display surface may have a polygonal shape, a circular shape, and an oval shape.

FIG. 1 shows that the thin film transistor array substrate 10 has a flat panel shape, but the disclosure is not limited thereto. The thin film transistor array substrate 10 may have both ends bent in the Y-axis direction. In other examples, the thin film transistor array substrate 10 may be flexible and may be curved, twisted, bent, folded, or rolled.

The protective substrate 20 may be bonded to the thin film transistor array substrate 10.

The protective substrate 20 may provide rigidity against external physical shock and insulate against electrical shock. The protective substrate 20 may be made of a transparent material that may be rigid and may be an insulator.

The display driving circuit 31 outputs signals and voltages for driving the thin film transistor array substrate 10.

For example, the display driving circuit 31 may supply a data signal to a data line DL (refer to FIG. 4) of the thin film transistor array substrate 10, and may supply a first driving power to a first driving power line VDL (refer to FIG. 4) of the thin film transistor array substrate 10. The display driving circuit 31 may supply a scan control signal to a scan driver 33 (refer to FIG. 4) embedded in the thin film transistor array substrate 10.

The display driving circuit 31 may be provided as an integrated circuit IC.

An integrated circuit chip of the display driving circuit 31 may be directly packaged on the thin film transistor array substrate 10 by a chip on glass (COG) method, a chip on plastic (COP) method, or an ultrasonic bonding method. As shown in FIG. 2, the integrated circuit chip of the display driving circuit 31 may be disposed in an area that is not covered with the protective substrate 20 of the thin film transistor array substrate 10.

In another example, the integrated circuit chip of the display driving circuit 31 may be packaged on the display circuit board 32.

The display circuit board 32 may include an anisotropic conductive film. The display circuit board 32 may be a flexible printed circuit board, a printed circuit board, or a flexible film such as a chip on film.

The display circuit board 32 may be attached to electrode pads of the thin film transistor array substrate 10. Lead lines of the display circuit board 32 may be electrically connected to the electrode pads of the thin film transistor array substrate 10.

Figure 5:
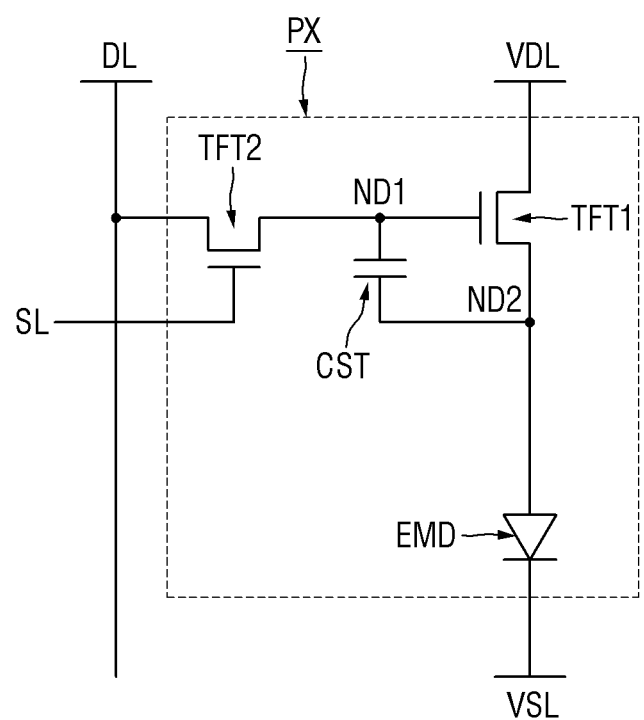
FIG. 5 is an schematic diagrams of an equivalent circuit illustrating an example of a pixel driving circuit corresponding to any one pixel area of FIG. 4.

Referring to FIG. 3, when the display device 1 is an organic light emitting display device, the thin film transistor array substrate 10 may include a substrate 11 including a display area DA (refer to FIG. 4), a circuit array 12 disposed on the substrate 11, including thin film transistors TFT1 and TFT2 (refer to FIG. 5), and a light emitting array 13 disposed on the circuit array 12, including light emitting elements EMD (refer to FIG. 5).

The display device 1 may further include a sealing layer 30 disposed at an edge between the thin film transistor array substrate 10 and the protective substrate 20, bonding the thin film transistor array substrate 10 and the protective substrate 20 to each other.

The display device 1 may further include a filling layer (not shown) filling a space between the thin film transistor array substrate 10 and the protective substrate 20.

Referring to FIG. 4, the thin film transistor array substrate 10 may include a display area DA for emitting light for displaying an image and a non-display area NDA near the display area DA. The non-display area NDA may be indicated as an area from an edge of the display area DA to an edge of the substrate 11 (refer to FIG. 3).

The thin film transistor array substrate 10 includes pixel areas PX arranged on the display area DA in a matrix form in a longitudinal and lateral direction. Each of the pixel areas PX may be a unit area for displaying individual luminance.

The non-display area NDA may include a display electrode pad area DPA disposed to be adjacent to the edge of the substrate 11. The thin film transistor array substrate 10 may further include a display electrode pad DP disposed in the display electrode pad area DPA of the non-display area NDA.

The display circuit board 32 (refer to FIG. 1 and FIG. 2) may be attached to the display electrode pad area DPA of the thin film transistor array substrate 10 and electrically connected to the display electrode pad DP.

The thin film transistor array substrate 10 further includes lines disposed in the display area DA, supplying signals or a power source to the pixel areas PX. The lines of the thin film transistor array substrate 10 may include a scan line SL, a data line DL, and a first driving power line VDL.

The scan line SL may be disposed in a left-right direction (X-direction).

The data line DL may be disposed in an up and down direction (Y-direction).

The first driving power line VDL 1 may be disposed in at least one of the left-right direction (X-direction) or the up and down direction (Y-direction). For example, the first driving power line VDL may be disposed in the up and down direction (Y-direction) like the data line DL.

The scan line SL supplies a scan signal for selecting a pixel area, in which a data signal is to be written, to pixel areas arranged in any one left-right direction (X-direction).

The scan line SL may be electrically connected to the scan driver 33 disposed in a portion of the non-display area NDA of the thin film transistor array substrate 10.

The scan driver 33 may receive a scan control signal from the display driving circuit 31 through at least one scan control line SCL.

The scan driver 33 may sequentially supply the scan signal to scan lines SL arranged in the display area DA for each frame period for displaying an image, based on the scan control signal.

Referring to FIG. 4, the scan driver 33 may be disposed on a portion of the non-display area NDA adjacent to a left side of the display area DA. However, this is only an example, and the scan driver 33 may be disposed on another portion of the non-display area NDA adjacent to a right side of the display area DA. In other examples, the scan driver 33 may be disposed on both sides in a left-right direction of the display area DA.

The data line DL may be electrically connected to the pixel areas arranged in any one up and down direction (Y-direction) and supplies a data signal corresponding to the luminance of each pixel area.

The data line DL may be electrically connected to the display driving circuit 31, and the display driving circuit 31 may supply the data signal of each of the pixel areas supplied with the scan signal, to the data line DL.

The display driving circuit 31 may be electrically connected to the display electrode pad DP through a data link line DLL, and may receive digital video data and timing signals from the display circuit board 32 electrically connected to the display electrode pad DP.

The first driving power line VDL supplies the first driving power for driving the light emitting element EMD (refer to FIG. 5).

The first driving power line VDL may receive the first driving power from the display driving circuit 31 or the display circuit board 32.

Each of the pixel areas PX includes a pixel driving circuit that supplies a driving current to the light emitting element EMD based on signals and a power source, which are supplied through the scan line SL, the data line DL and the first driving power line VDL.

FIG. 5 is a schematic diagram of an equivalent circuit illustrating a pixel driving circuit corresponding to a pixel area PX of FIG. 4.

Referring to FIG. 5, each pixel area PX (refer to FIG. 4) may include a light emitting element EMD, a first thin film transistor TFT1, a second thin film transistor TFT2, and a storage capacitor CST.

The light emitting element EMD may be an organic light emitting diode (OLED) that includes a light emitting layer made of an organic light emitting material. In other examples, the light emitting element EMD may include a light emitting layer made of a photoelectric conversion material.

The first thin film transistor TFT1 may be electrically connected with the light emitting element EMD in series between the first driving power line VDL and the second driving power line VSL. The second driving power line VSL may supply a second driving power having a lower voltage level than the first driving power based on the first driving power line VSL.

For example, an anode electrode of the light emitting element EMD may be electrically connected to a drain electrode of the first thin film transistor TFT1, and a cathode electrode of the light emitting element EMD may be electrically connected to the second driving power line VSL.

A source electrode of the first thin film transistor TFT1 may be electrically connected to the first driving power line VDL.

A link node of the source electrode and the drain electrode may be changed depending on a structure type of the first thin film transistor TFT1.

The storage capacitor CST may be disposed between a first node ND1 and a second node ND2. The first node ND1 may be a contact point between a gate electrode of the first thin film transistor TFT1 and the second thin film transistor TFT2. The second node ND2 may be a contact point between the first thin film transistor TFT1 and the light emitting element EMD.

The second thin film transistor TFT2 may be disposed between the data line DL and the first node ND1 and turned on based on the scan signal of the scan line SL. When the second thin film transistor TFT2 is turned on by the scan signal of the scan line SL, the data signal of the data line DL is supplied to a first node ND1, and to the gate electrode of the first thin film transistor TFT1 and to the storage capacitor CST through the second thin film transistor TFT2.

The first thin film transistor TFT1 may generate a driving current between the first driving power line VDL and the second driving power line VSL. The driving current may have a magnitude corresponding to the voltage difference between the first driving power line and the first node ND1. The light emitting element EMD emits light with a luminance corresponding to the driving current of the first thin film transistor TFT1.

FIG. 5 shows a pixel driving circuit of the pixel areas PX may have a 2T1C structure that includes a first thin film transistor TFT1 and a second thin film transistor TFT2, but this is only an example. The pixel driving circuit according to the disclosure is not limited to the 2T1C structure, and may have a different structure from FIG. 5. For example, the pixel driving circuit may further include a thin film transistor for compensating or sensing the second node ND2.

FIG. 5 shows that the first thin film transistor TFT1 and the second thin film transistor TFT2 may be formed of metal oxide semiconductor field effect transistors (MOSFETs), but this is only an example. At least one of the first thin film transistor TFT1 or the second thin film transistor TFT2 may be a P-type MOSFET.

Figure 6:
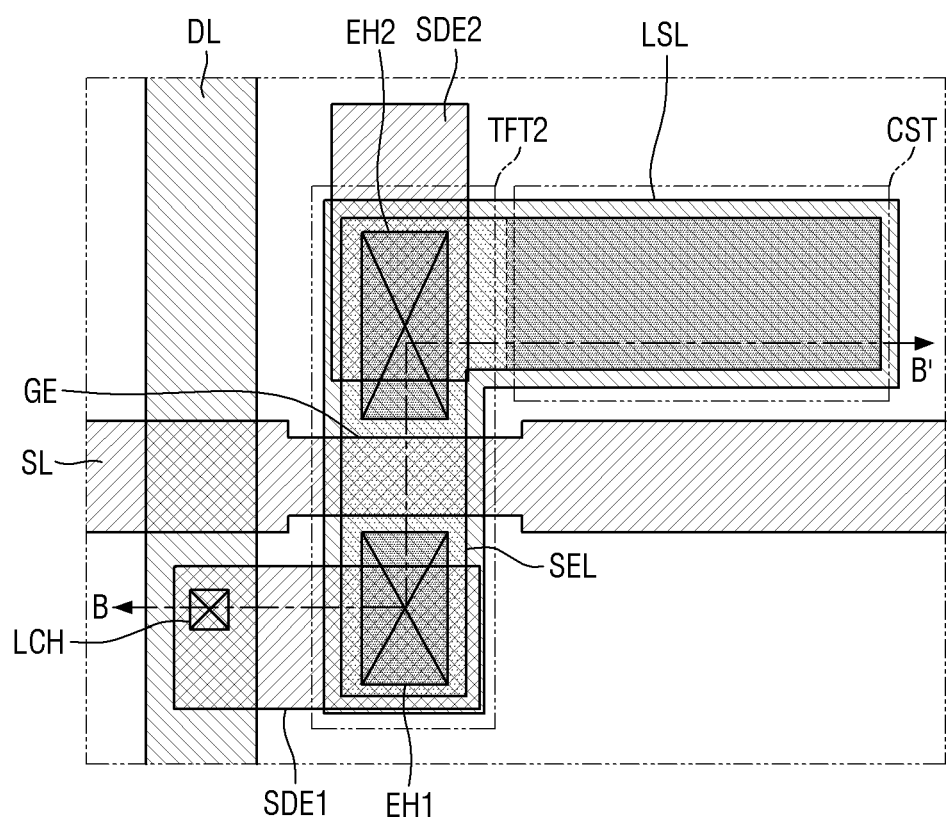
FIG. 6 is a schematic plan view illustrating an example of a second thin film transistor and a storage capacitor of FIG. 5.
Figure 7:
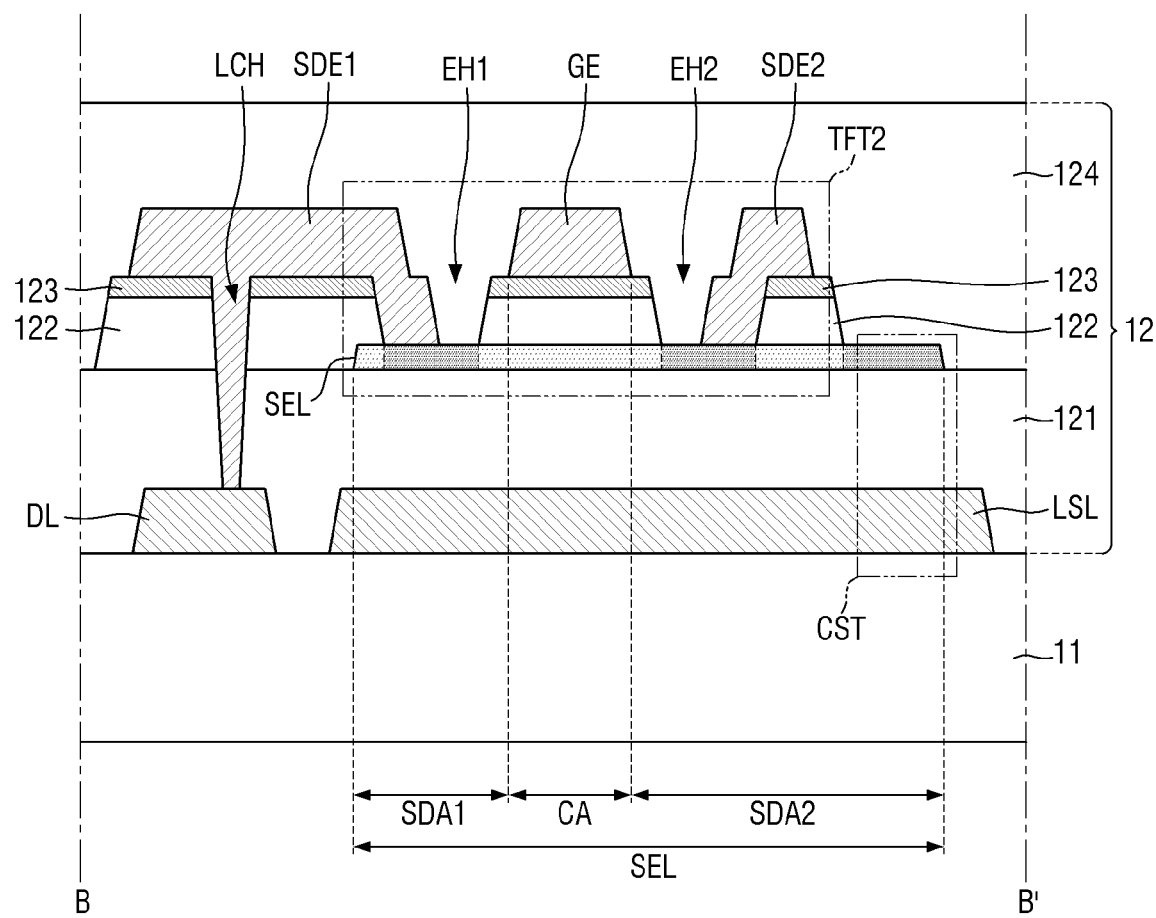
FIG. 7 is a schematic cross-sectional view along line B-B' of FIG. 6.

FIG. 6 is a schematic plan view illustrating an example of the second thin film transistor and the storage capacitor of FIG. 5. FIG. 7 is a schematic cross-sectional view along line B-B' of FIG. 6.

Referring to FIG. 6, the circuit array 12 of the thin film transistor array substrate 10 according to an embodiment may include a scan line SL extending in a first direction (left-right direction in FIG. 6), a data line DL extending in a second direction (the up-down direction in FIG. 6) intersecting the first direction, and a first thin film transistor TFT1, a second thin film transistor TFT2 and a storage capacitor CST, which correspond to each of the pixel areas PX.

The second thin film transistor TFT2 may be electrically connected between the data line DL and the gate electrode of the first thin film transistor TFT1 and includes a gate electrode GE electrically connected to the scan line SL.

An electrode of the storage capacitor CST is electrically connected to the gate electrode of the first thin film transistor TFT1 and the other electrode thereof is electrically connected to the light emitting element EMD (refer FIG. 5).

The second thin film transistor TFT2 may include a light shielding layer LSL, a semiconductor layer SEL that at least partially overlaps the light shielding layer LSL in a plan view, a gate electrode GE that overlaps the channel area CA (refer to FIG. 7) of the semiconductor layer SEL, a first electrode hole EH1 corresponding to a portion of a first electrode area SDA1 (refer to FIG. 7) that may contact one side of the channel area CA of the semiconductor layer SEL, a second electrode hole EH2 corresponding to a portion of a second electrode area SDA2 (refer to FIG. 7) that electrically contacts the other side of the channel area CA of the semiconductor layer SEL, a first electrode SDE1 electrically connecting the first electrode area SDA1 of the semiconductor layer SEL with the data line DL, electrically connected to the first electrode area SDA1 of the semiconductor layer SEL through the first electrode hole EH1, and a second electrode SDE2 spaced apart from the first electrode SDE1 and electrically connected to the second electrode area SDA2 of the semiconductor layer SEL through the second electrode hole EH2.

The first electrode SDE1 may be electrically connected to the data line DL through a line contact hole LCH corresponding to a portion of the data line DL.

Referring to FIG. 5, the second electrode SDE2 of the second thin film transistor TFT2 may be electrically connected to the gate electrode of the first thin film transistor TFT1.

The first thin film transistor TFT1 may include a gate electrode (not shown) electrically connected to the second thin film transistor TFT2, a first electrode (not shown) electrically connected to the first driving power line VDL, and a second electrode electrically connected to the light emitting element EMD.

The light shielding layer LSL may be electrically connected to the second electrode of the first thin film transistor TFT1 and may overlap, in a plan view, the second electrode area SDA2 of the semiconductor layer SEL of the second thin film transistor TFT2. Thus, the light shielding layer LSL may serve as an electrode of the storage capacitor CST.

Although FIG. 6 shows the light shielding layer LSL may overlap the semiconductor layer SEL of the second thin film transistor TFT2, this is only an example. The light shielding layer LSL may be extended to overlap, in a plan view, at least one of the semiconductor layer (not shown), the gate electrode (not shown), or the first and second electrodes (not shown), which constitute the first thin film transistor TFT1, unlike the example in FIG. 6.

Another portion of the second electrode area SDE2 of the semiconductor layer SEL of the second thin film transistor TFT2, which may not overlap the second electrode SDE2 of the second thin film transistor TFT2, may overlap the light shielding layer LSL in a plan view. The storage capacitor CST may be provided by an area where the second electrode area SDE2 of the semiconductor layer SEL of the second thin film transistor TFT2 and the light shielding layer LSL overlap each other in a plan view.

The gate electrode GE of the second thin film transistor TFT2 may be comprised of a portion of the scan line SL.

Referring to FIG. 7, the thin film transistor array substrate 10 according to one embodiment includes pixel areas PX for displaying an image, and includes thin film transistors TFT1 and TFT2 corresponding to each of the pixel areas PX, a scan line SL (refer to FIGS. 5 and 6) electrically connected to the thin film transistor TFT (refer to FIG. 5) of the pixel areas PX and extended in a first direction, and a data line DL electrically connected to the thin film transistor TFT2 (refer to FIG. 5) of the pixel areas PX and extended in a second direction intersecting the first direction.

The second thin film transistor TFT2 of each of the pixel areas PX may include a semiconductor layer SEL, a gate insulating layer 122 covering the semiconductor layer SEL, a diffusion barrier layer 123 covering the gate insulating layer 122, a first electrode hole EH1, a second electrode hole EH2, a gate electrode GE disposed on the diffusion barrier layer 123, a first electrode SDE1, and a second electrode SDE2 (both the first and second electrodes SDE1 and SDE2 may be disposed on the diffusion barrier layer 123). The semiconductor layer SEL may include first and second electrode areas SDA1 and SDA2 that contact the channel area CA and both sides of the channel area CA. The first electrode hole EH1 may pass through the gate insulating layer 122 and the diffusion barrier layer 123 and corresponding to a portion of the first electrode area SDA1 of the semiconductor layer SEL. The second electrode hole EH2 may pass through the gate insulating layer 122 and the diffusion barrier layer 123 and corresponding to a portion of the second electrode area SDA2 of the semiconductor layer SEL. The gate electrode GE may overlap the channel area CA of the semiconductor layer SEL in a plan view. The first electrode SDE1 may be electrically connected to the first electrode area SDA1 of the semiconductor layer SEL through the first electrode hole EH1. The second electrode SDE2 may be electrically connected to the second electrode area SDA2 of the semiconductor layer SEL through the second electrode hole EH2.

The second thin film transistor TFT2 may further include a light shielding layer LSL disposed on the substrate 11. The semiconductor layer SEL may be disposed on a buffer layer 121 covering the light shielding layer LSL.

The scan line SL (refer to FIG. 6) may be disposed on the diffusion barrier layer 123 like the gate electrode GE. The gate electrode GE may be comprised of a portion of the scan line SL. In other examples, the gate electrode GE may be comprised of a portion of a pattern that branches from the scan line SL.

When the scan line SL is disposed on the same layer as the gate electrode GE, the data line DL may not be disposed on the same layer as the first electrode SDE1, and the first electrode SDE1 may be electrically connected to the data line DL through the line contact hole LCH.

The first electrode SDE1 may be disposed on the same layer as the gate electrode GE, and the scan line SL and the data line DL (refer to FIG. 6) may each extend in a direction intersecting each other. Therefore, the data line DL is not disposed on the same layer as the first electrode SDE1 to insulate the data line DL from the scan line SL.

As an example, the data line DL may be disposed on the substrate 11 and covered with the buffer layer 121 together with the light shielding layer LSL. The line contact hole LCH electrically connecting the data line DL and the first electrode SDE1 may pass through the buffer layer 121, the gate insulating layer 122, and the diffusion barrier layer 123.

The substrate 11 may include pixel areas PX for displaying an image. The substrate 11 may include a display area DA (refer to FIG. 4) in which the pixel areas PX are arranged, and a non-display area NDA (refer to FIG. 4) near the display area DA.

The substrate 11 may be formed of an insulating material. For example, the substrate 11 may be made of an insulating material such as glass, quartz, or a polymer resin. An example of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CTA), cellulose acetate propionate (CAP) or a combination thereof.

In order to rigidly support the circuit array 12 and the light emitting array 13, which are provided on the thin film transistor array substrate 10, the substrate 11 may be rigid.

In other examples, the substrate 11 may be made of a soft insulating material that may flexibly facilitate bending, folding, rolling, etc. and allow deformation.

The substrate 11 may be made of a metal material.

The light shielding layer LSL may be made of a conductive light shielding material. For example, the light shielding layer LSL may be made of a metal material such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a combination thereof.

The buffer layer 121 may be entirely disposed on the substrate 11, and covers the light shielding layer LSL and the data line DL on the substrate 11.

The buffer layer 121 may be formed of a single layer or multiple layers of at least one of silicon nitride, silicon oxide, and silicon oxynitride.

The semiconductor layer SEL may be made of an oxide semiconductor. The oxide semiconductor may include oxygen (O) and a metal including at least one of indium (In), gallium (Ga), zinc (Zn), tin (Sn), titanium (Ti), zirconium (Zr), and hafnium (Hf). For example, the semiconductor layer SEL may be made of In—Ga—Zn—O (IGZO).

The semiconductor layer SEL may include a channel area CA, and first and second electrode areas SDA1 and SDA2 that contact both sides of the channel area CA.

A channel in which a carrier moves may be generated in the channel area CA from the voltage difference between the channel area CA and at least one of the first electrode area SDA1 and the second electrode area SDA2.

A portion of each of the first electrode area SDA1 and the second electrode area SDA2 may be conductorized by a doping material.

The gate insulating layer 122 may cover the semiconductor layer SEL on the buffer layer 121.

The gate insulating layer 122 may include a silicon compound, a metal oxide, and the like. For example, the gate insulating layer 122 may include silicon oxide, silicon nitride, silicon oxynitride, aluminum oxide, tantalum oxide, hafnium oxide, zirconium oxide, titanium oxide, and the like.

The diffusion barrier layer 123 may be disposed on the gate insulating layer 122.

The diffusion barrier layer 123 may prevent the semiconductor layer SEL from exposure to a doping material such as hydrogen and fluorine, which may be contained in a mask material, a conductive material or an insulating material. The doping material may be disposed on the gate insulating layer 122.

The diffusion barrier layer 123 may be made of titanium (Ti), and may be disposed at a thickness of about 150 Å or more.

The diffusion barrier layer 123 may prevent the doping material disposed on the gate insulating layer 122 from being injected into the semiconductor layer SEL, for example the channel area CA of the semiconductor layer SEL. Doping material may be used in processes performed after the semiconductor layer SEL is disposed, and such doping materials may be prevented from being injected into the channel area CA of the semiconductor layer SEL. Thus, the channel area CA of the semiconductor layer SEL may be prevented from being conductorized, and the differences between threshold voltages of the thin film transistors of the pixel areas PX may be prevented from increasing.

The first electrode hole EH1 may pass through the gate insulating layer 122 and the diffusion barrier layer 123 and may expose a portion of the first electrode area SDA1 of the semiconductor layer SEL. A portion of the first electrode area SDA1 of the semiconductor layer SEL, which corresponds to the first electrode hole EH1, may be conductorized by injection of the doping material.

The second electrode hole EH2 passes through the gate insulating layer 122 and the diffusion barrier layer 123 and exposes a portion of the second electrode area SDA2 of the semiconductor layer SEL. A portion of the second electrode area SDA2 of the semiconductor layer SEL, which corresponds to the second electrode hole EH2, may be conductorized by injection of the doping material.

During the process of disposing the first electrode hole EH1 and the second electrode hole EH2, when the first electrode hole EH1 and the second electrode hole EH2 are completely disposed, a portion of the first electrode area SDA1 of the semiconductor layer SEL, which corresponds to the first electrode hole EH1, and a portion of the second electrode area SDA2 of the semiconductor layer SEL, which corresponds to the second electrode hole EH2, may be exposed to an etching material for patterning the gate insulating layer 122 and the diffusion barrier layer 123 through the first electrode hole EH1 and the second electrode hole EH2. A portion of the first electrode area SDA1 of the semiconductor layer SEL, which corresponds to the first electrode hole EH1, and a portion of the second electrode area SDA2 of the semiconductor layer SEL, which corresponds to the second electrode hole EH2, may be conductorized by a doping material such as hydrogen (H) or fluorine (F) contained in the etching material.

The gate electrode GE, the first electrode SDE1, and the second electrode SDE2 may be disposed in the same layer, made of the same material and may be spaced apart from one another.

The gate electrode GE, the first electrode SDE1, and the second electrode SDE2 may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof. For example, the gate electrode GE, the first electrode SDE1, and the second electrode SDE2 may be made of any one of a single layer of molybdenum (Mo), a double layer of molybdenum (Mo)/titanium (Ti), a double layer of titanium (Ti)/copper (Cu), and a triple layer of titanium (Ti)/aluminum (Al)/titanium (Ti).

The gate electrode GE may be disposed on the diffusion barrier layer 123 and may overlap, in a plan view, the channel area CA of the semiconductor layer SEL.

The first electrode SDE1 may be disposed on the diffusion barrier layer 123 and may be spaced apart from the gate electrode GE. The first electrode SDE1 may be electrically connected to the first electrode area SDA1 of the semiconductor layer SEL through the first electrode hole EH1.

The first electrode SDE1 may extend and overlap, in a plan view, a portion of the data line DL.

A portion of the data line DL may be exposed by the line contact hole LCH that passes through the diffusion barrier layer 123, the gate insulating layer 122, and the buffer layer 121. Therefore, the first electrode SDE1 may be electrically connected to the data line DL through the line contact hole LCH.

The second electrode SDE2 may be disposed on the diffusion barrier layer 123 and spaced apart from each of the gate electrode GE and the first electrode SDE1. The second electrode SDE2 may be electrically connected to the second electrode area SDA2 of the semiconductor layer SEL through the second electrode hole EH2.

Another portion of the second electrode area SDA2 of the semiconductor layer SEL may overlap, in a plan view, the light shielding layer LSL without overlapping the second electrode SDE2. A storage capacitor CST may be provided by an area where the second electrode area SDA2 of the semiconductor layer SEL and the light shielding layer LSL overlap each other.

The gate insulating layer 122 and the diffusion barrier layer 123, which correspond to the remainder of the semiconductor layer SEL may be removed, except the portions that overlap the gate electrode GE, the first electrode SDE1 and the second electrode SDE2. Therefore, the remainder of the semiconductor layer SEL (excluding the portions that overlap, in a plan view, the gate electrode GE, the first electrode SDE1 and the second electrode SDE2) may be exposed to the etching material that removes the gate insulating layer 122 and the diffusion barrier layer 123. The remainder of the semiconductor layer SEL may be conductorized.

Therefore, a portion of the second electrode area SDA2 of the semiconductor layer SEL, which may overlap the light shielding layer LSL in a plan view, may be exposed to the etching material used to remove the diffusion barrier layer 123 and the gate insulating layer 122. This portion may be conductorized.

The thin film transistor array substrate 10 may further include an interlayer insulating layer 124 covering the gate electrode GE, the first electrode SDE1 and the second electrode SDE2.

The interlayer insulating layer 124 may be made of an inorganic insulating material such as silicon oxide, silicon nitride, silicon oxynitride, hafnium oxide, aluminum oxide, titanium oxide, tantalum oxide, and zinc oxide.

In other examples, the interlayer insulating layer 124 may be made of an organic insulating material such as an acrylic resin (polyacrylates resin), an epoxy resin, a phenolic resin, a polyamides resin, a polyimides resin, an unsaturated polyester resin, a poly phenylenethers resin, a polyphenylenesulfides resin, or benzocyclobutene (BCB).

In other examples, the interlayer insulating layer 124 may be made of a stacked structure of multiple different insulating material layers.

The remainder of the semiconductor layer SEL excluding the portions which overlap, in a plan view, the gate electrode GE, the first electrode SDE1 and the second electrode SDE2, may not be covered with the gate insulating layer 122 and the diffusion barrier layer 123, and thus may contact the interlayer insulating layer 124.

The first thin film transistor TFT1 (refer to FIG. 5) provided in the thin film transistor array substrate 10 may have the same cross-sectional structure as that of the second thin film transistor TFT2 shown in FIG. 7 except that the gate electrode (not shown) may be a pattern electrically connected to the second electrode SDE2 of the second thin film transistor TFT2, the first electrode SDE1 may be electrically connected to the first driving power line VDL (refer to FIG. 5) and the second electrode SDE2 is electrically connected to the anode electrode of the light emitting element EMD (refer to FIG. 5). Therefore, descriptions of the first thin film transistor TFT1 will not be repeated.

As described above, the second thin film transistor TFT2 provided in the thin film transistor array substrate 10 according to an embodiment of the disclosure includes a first electrode SDE1 and a second electrode SDE2, and a gate electrode GE which are disposed on a same layer. Therefore, the number of mask processes for the arranging of the thin film transistor may be reduced.

The second thin film transistor TFT2 provided in the thin film transistor array substrate 10 according to an embodiment includes a diffusion barrier layer 123 disposed on the gate insulating layer 122. Since the diffusion barrier layer 123 shields doping material, such as hydrogen (H) and fluorine (F) which may be contained in the insulating material, the etching material and the mask material, the diffusion barrier layer 123 may prevent the channel area CA of the semiconductor layer SEL from being conductorized.

As the first electrode SDE1 and the second electrode SDE2 are disposed on the same layer as the gate electrode GE, the first electrode hole EH1 and the second electrode hole EH2 are disposed before the gate electrode GE is disposed. At this time, as the diffusion barrier layer 123 is interposed between the patterning mask (not shown) for positioning the first electrode hole EH1 and the second electrode hole EH2 and the gate insulating layer 122, the channel area CA of the semiconductor layer SEL may be shielded from being conductorized by the doping material included in the patterning mask.

As a result, since the threshold voltages of the thin film transistors of the pixel areas PX may be more uniform, the luminance characteristics of the pixel areas PX may be more uniform, and display quality of the display device 1 may be improved.

Figure 8:
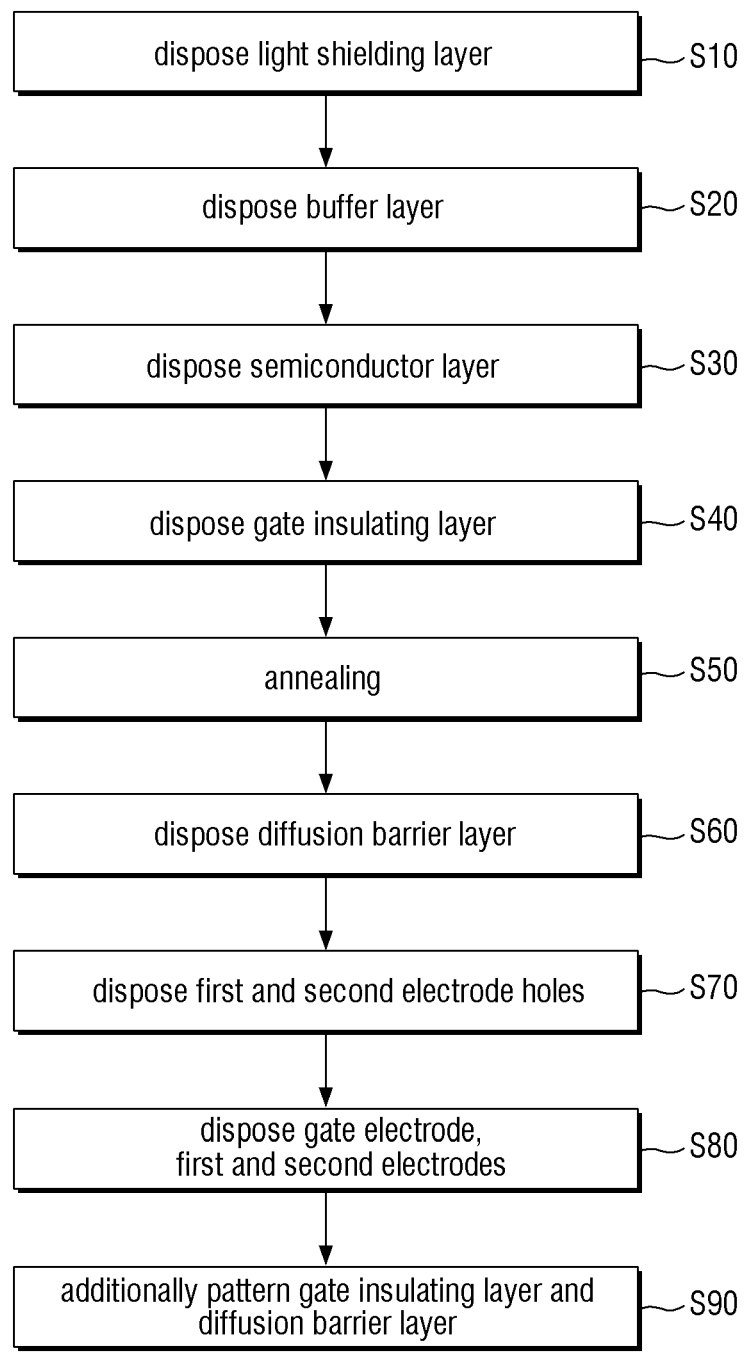
FIG. 8 is a flow chart illustrating a method for fabricating a thin film transistor array substrate according to an embodiment.

FIG. 8 is a flow chart illustrating a method for fabricating a thin film transistor array substrate according to one embodiment of the disclosure. FIGS. 9 to 23 are process views of steps of FIG. 8.

Referring to FIG. 8, a method for fabricating a thin film transistor array substrate according to an embodiment includes a step S30 of disposing a semiconductor layer SEL, a step S40 of disposing a gate insulating layer 122 covering the semiconductor layer SEL, a step S60 of disposing a diffusion barrier layer 123 covering the gate insulating layer 122, a step S70 of disposing first and second electrode holes EH1 and EH2 that pass through the gate insulating layer 122 and the diffusion barrier layer 123, and a step S80 of disposing a gate electrode GE, a first electrode SDE1 and a second electrode SDE2 on the diffusion barrier layer 123.

The method for fabricating a thin film transistor array substrate may further include a step S10 of disposing a light shielding layer LSL on a substrate 11 and a step S20 of disposing a buffer layer 121 covering the light shielding layer LSL on the substrate 11 before the step S30 of disposing the semiconductor layer SEL.

The method for fabricating a thin film transistor array substrate may further include a step S50 of performing annealing to reduce a concentration of hydrogen (H) in the semiconductor layer SEL and the gate insulating layer 122 after the step S40 of disposing the gate insulating layer 122.

The method for fabricating a thin film transistor array substrate may further include a step S90 of additionally patterning the diffusion barrier layer 123 and the gate insulating layer 122 based on the gate electrode GE, the first electrode SDE1, and the second electrode SDE2 after the step S80 of disposing the gate electrode GE, the first electrode SDE1 and the second electrode SDE2.

Figure 9:
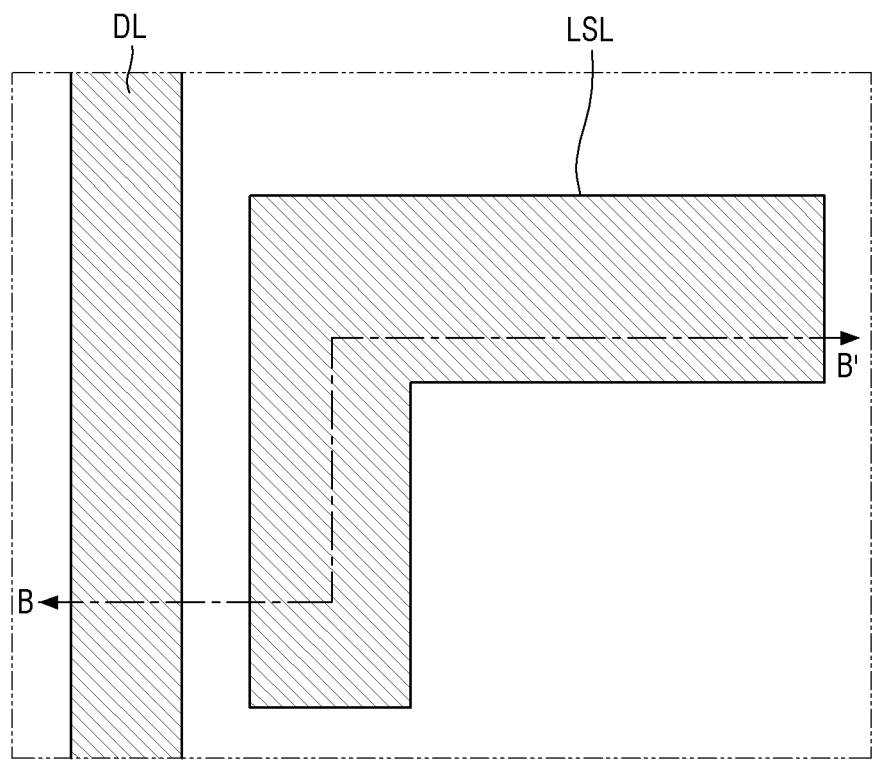
FIGS. 9 to 23 are schematic process views of steps of FIG. 8.
Figure 10:
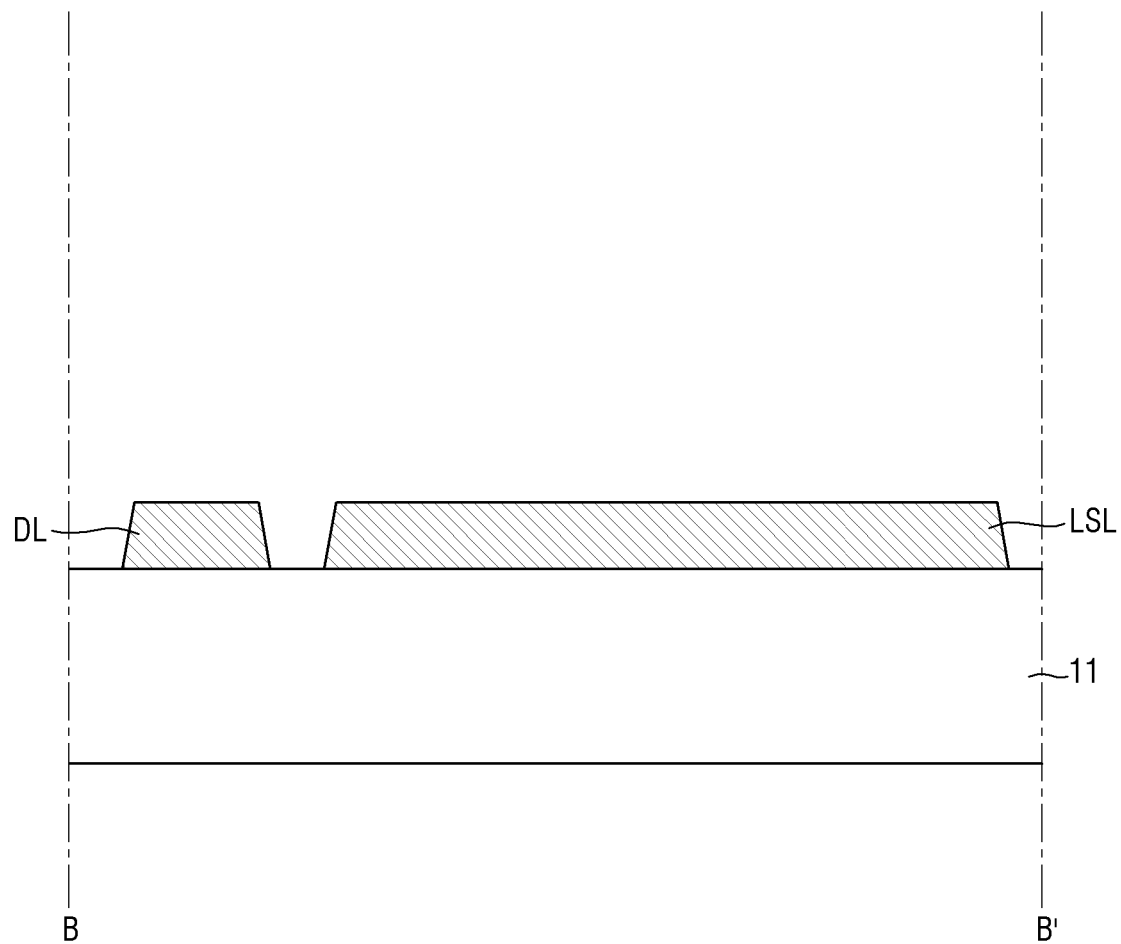

Referring to FIGS. 9 and 10, step S10 of disposing the light shielding layer LSL on the substrate 11 may be performed. At this time, in step S10 of disposing the light shielding layer LSL, a data line DL extended in an up and down direction may be further disposed on the substrate 11.

The substrate 11 includes pixel areas PX, and the light shielding layer LSL corresponds to each of the pixel areas PX. For example, the light shielding layer LSL may correspond to each of thin film transistors TFT1 and TFT2 (refer to FIG. 5) included in the thin film transistor array substrate 10. In other examples, the light shielding layer LSL may correspond to two or more thin film transistors within a pattern disposed on the same layer as the light shielding layer LSL. The light shielding layer LSL may correspond to thin film transistors that are spaced apart within a selected range from the data line DL.

The light shielding layer LSL may be made of a material having conductivity and light shielding properties.

Figure 11:
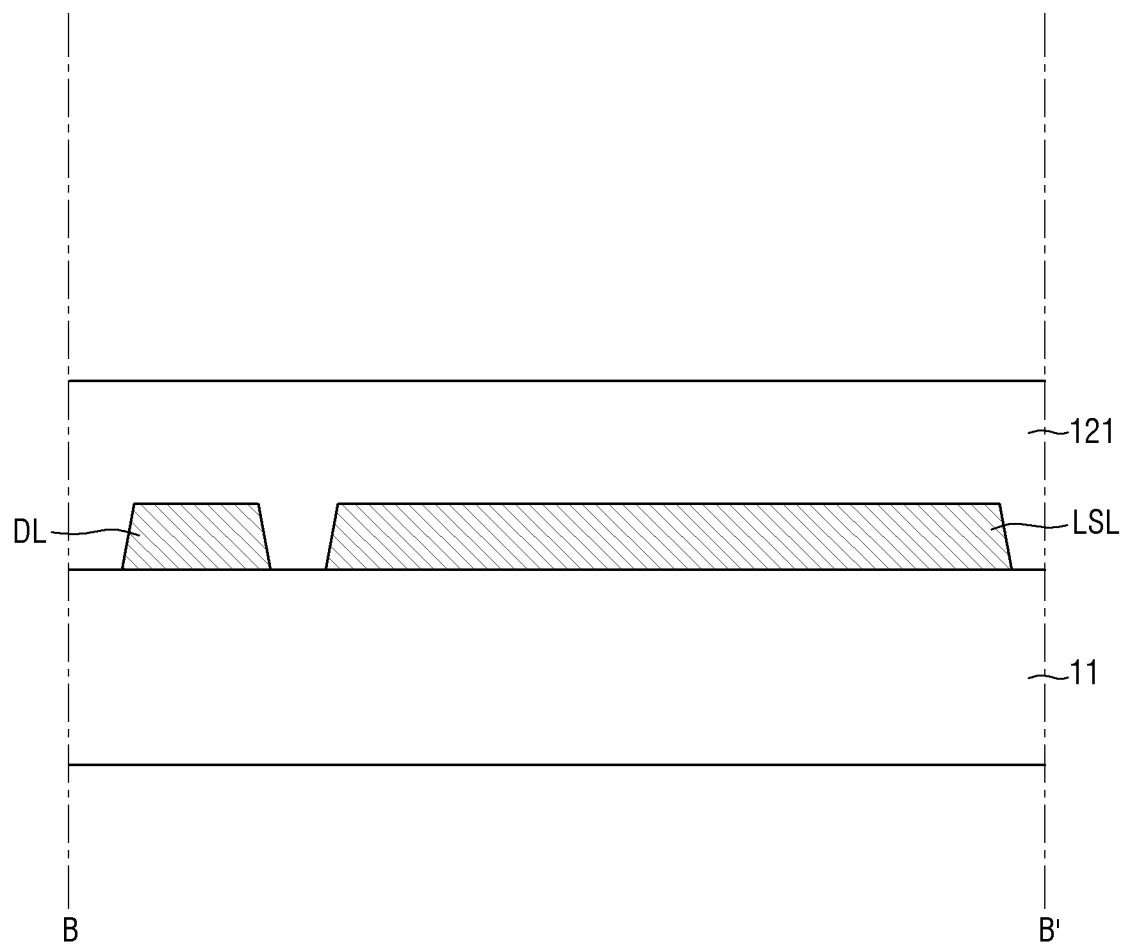

Referring to FIG. 11, the step S20 of disposing the buffer layer 121 covering the light shielding layer LSL on the substrate 11 may be performed.

The buffer layer 121 may be formed of a single layer or multiple layers of at least one of silicon nitride, silicon oxide, and silicon oxynitride.

Figure 12:
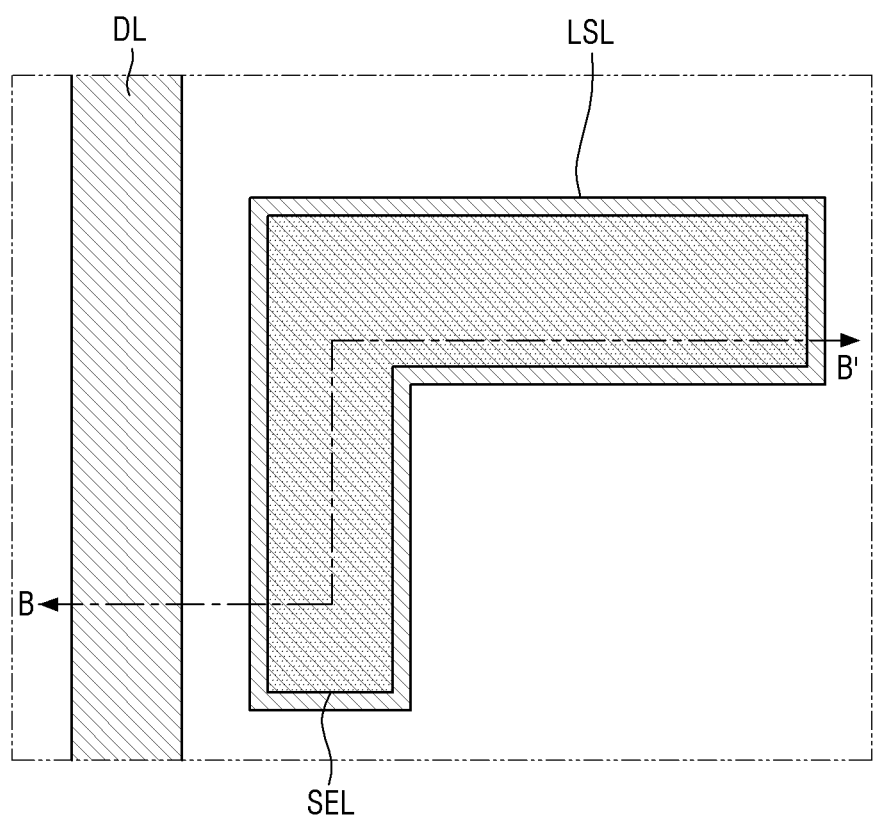
Figure 13:
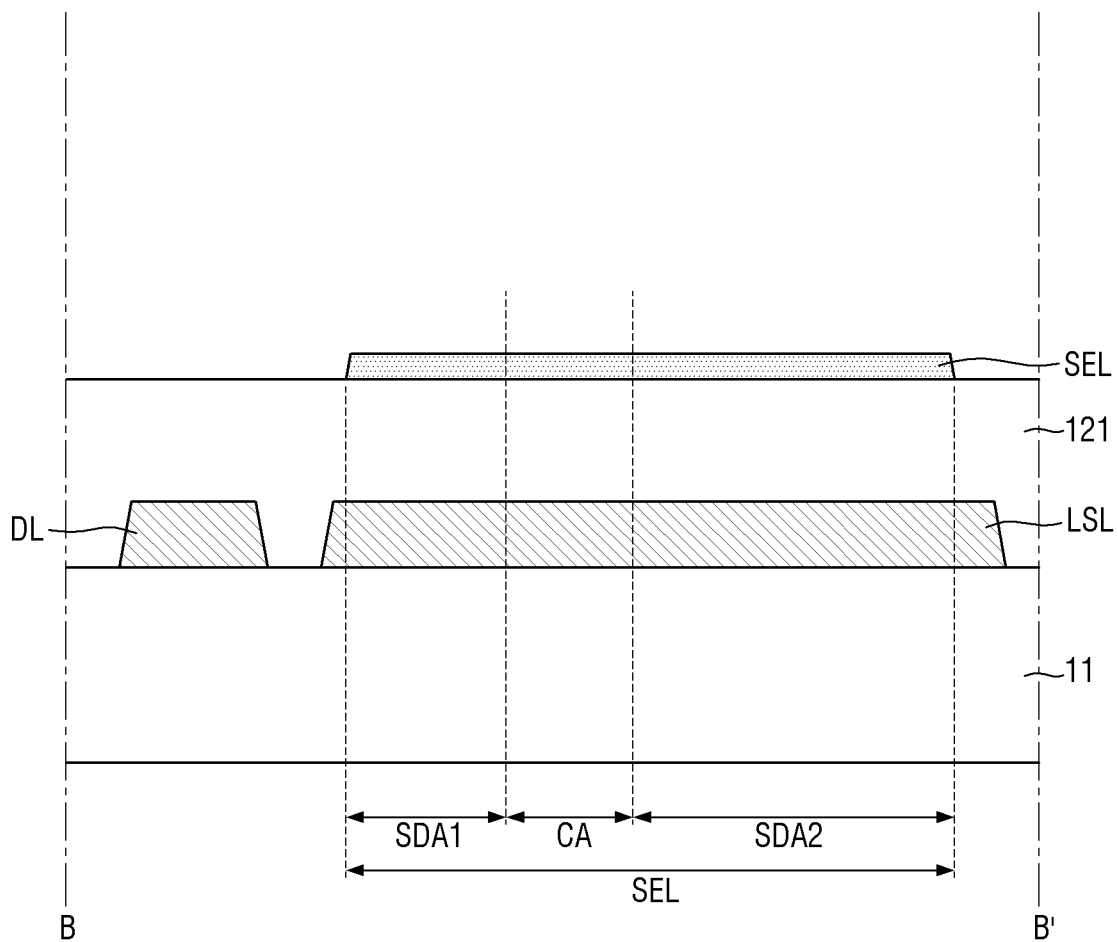

Referring to FIGS. 12 and 13, the step of S30 of disposing the semiconductor layer SEL on the buffer layer 121 may be performed.

The semiconductor layer SEL may be made of an oxide semiconductor. The oxide semiconductor may include oxygen (O) and at least one of a metal indium (In), gallium (Ga), zinc (Zn), tin (Sn), titanium (Ti), zirconium (Zr), and hafnium (Hf). For example, the semiconductor layer SEL may be made of In—Ga—Zn—O (IGZO).

The semiconductor layer SEL may correspond to each of the thin film transistors TFT1 and TFT2 (refer to FIG. 5) included in the thin film transistor array substrate 10.

The semiconductor layer SEL includes a channel area CA, and first and second electrode areas SDA1 and SDA2 that may electrically contact both sides of the channel area CA.

Figure 14:
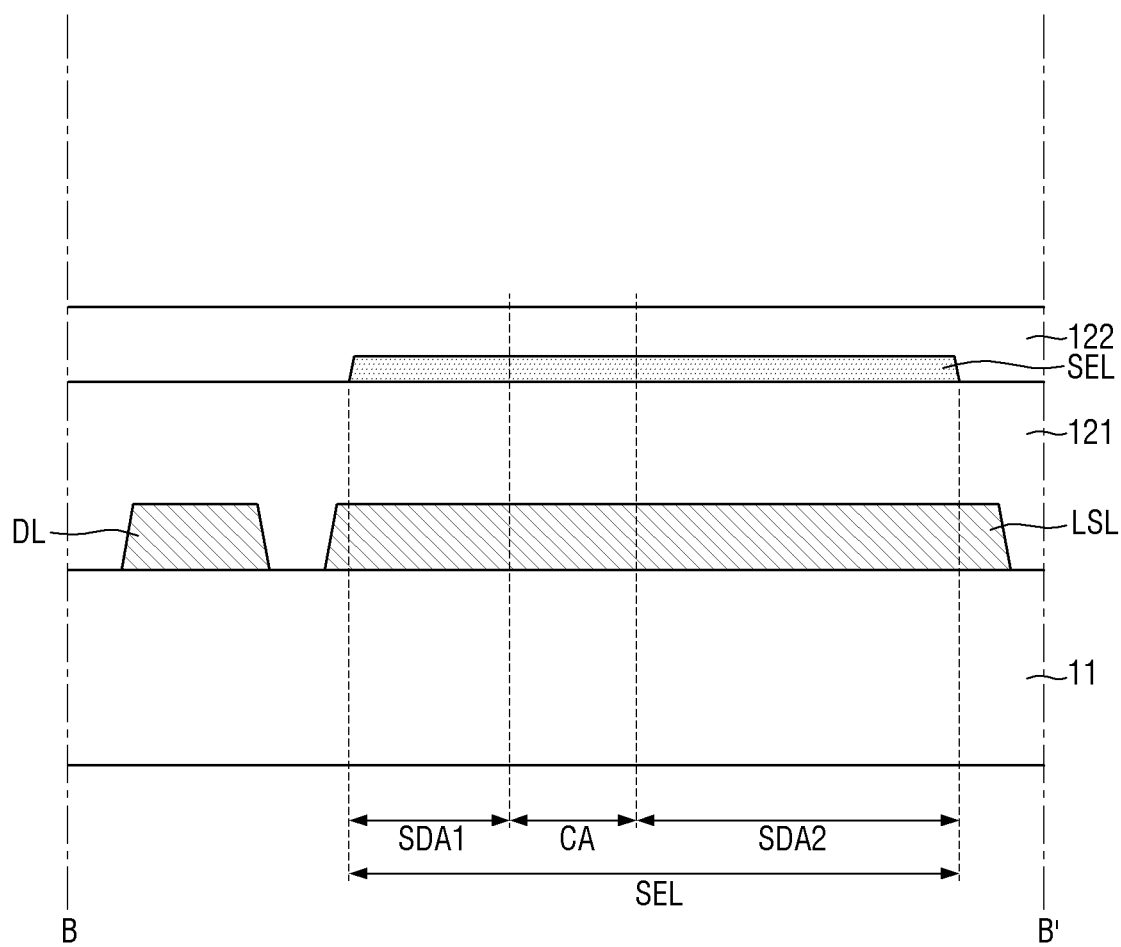

Referring to FIG. 14, the step S40 of disposing the gate insulating layer 122 covering the semiconductor layer SEL on the buffer layer 121 may be performed.

The gate insulating layer 122 may include a silicon compound, a metal oxide, and the like. For example, the gate insulating layer 122 may include silicon oxide, silicon nitride, silicon oxynitride, aluminum oxide, tantalum oxide, hafnium oxide, zirconium oxide, titanium oxide, and the like.

Figure 15:
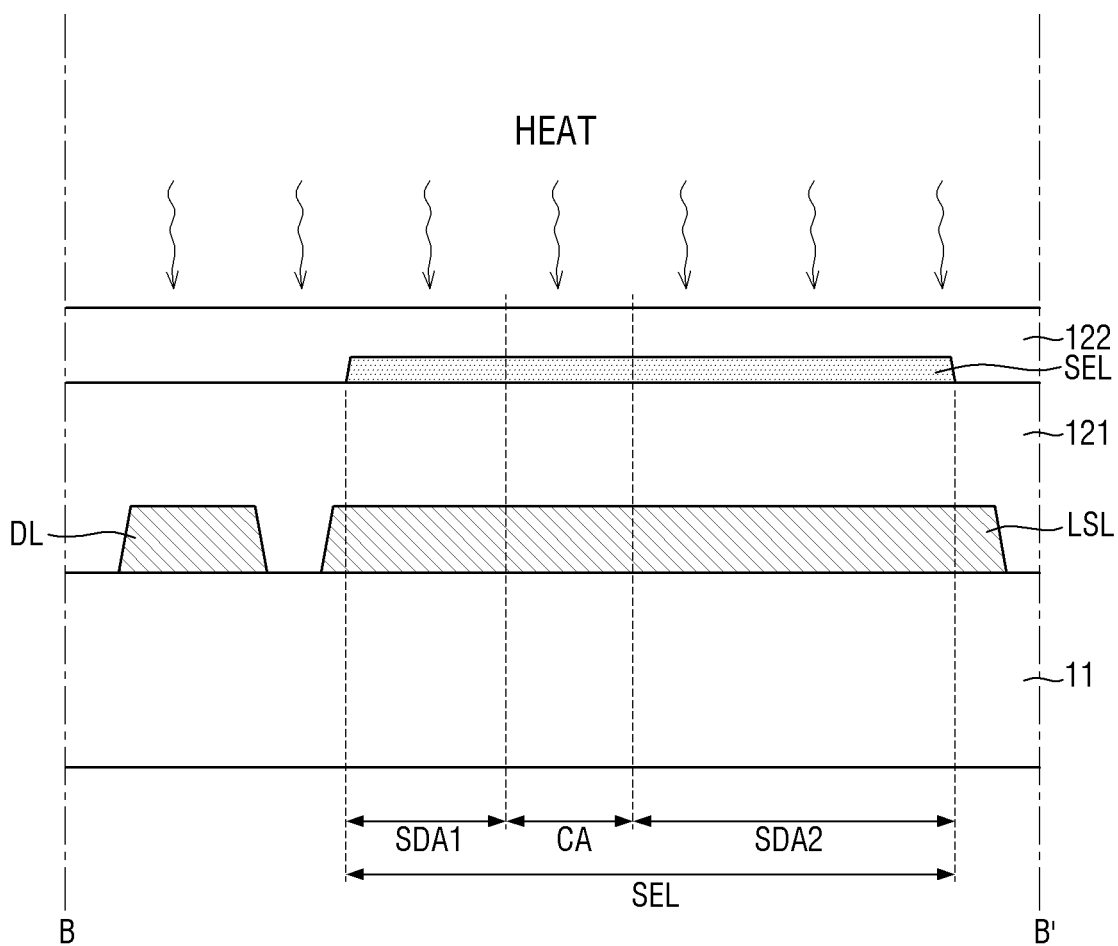

Referring to FIG. 15, an annealing (a heating) step S50 for dehydrogenation in the gate insulating layer 122 and the semiconductor layer SEL may be performed.

The annealing step of step S50 may be performed at a temperature of about 300° C. to about 350° C. to reduce the concentration of hydrogen (H) in the gate insulating layer 122 and the semiconductor layer SEL. Since the hydrogen (H) of the semiconductor layer SEL and the hydrogen (H) of the gate insulating layer 122, which may have been injected into the semiconductor layer SEL, may be partially removed, the semiconductor characteristics of the semiconductor layer SEL may be improved. Therefore, mobility in the channel area CA of the semiconductor layer SEL may be improved.

Figure 16:
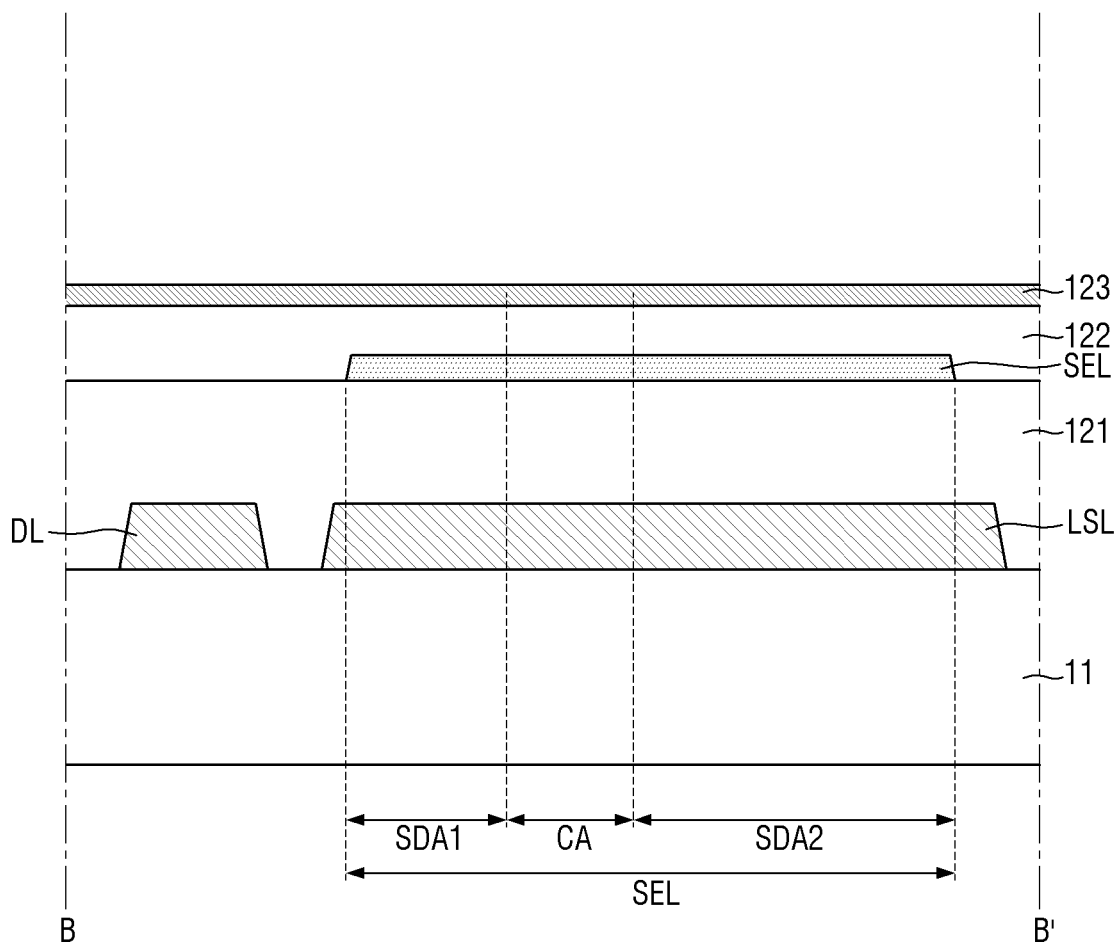

Referring to FIG. 16, the step S60 of disposing the diffusion barrier layer 123 covering the gate insulating layer 122 may be performed.

As the diffusion barrier layer 123 is disposed, a doping material, such as hydrogen (H) or fluorine (F), which may be contained in mask materials, insulating materials, and etching materials of subsequent processes, may be prevented from being injected into the channel area CA of the semiconductor layer. The semiconductor characteristics of the channel area CA of the semiconductor layer SEL may be maintained in the subsequent processes, and preventing deterioration of reliability of the thin film transistor switching elements, and may prevent the difference between the threshold voltage characteristics of the thin film transistors from increasing.

It may not be required to limit the mask materials, the insulating materials and the etching materials, which may be used in the subsequent processes, need not be limited to materials that do not include the doping material. High temperature processes may also be performed, and may thus help prevent any deterioration of process efficiency.

The diffusion barrier layer 123 may be formed of a single layer of titanium (Ti) for shielding the doping material.

The diffusion barrier layer 123 may have a thickness of about 150 Å or more to shield the doping material.

Figure 17:
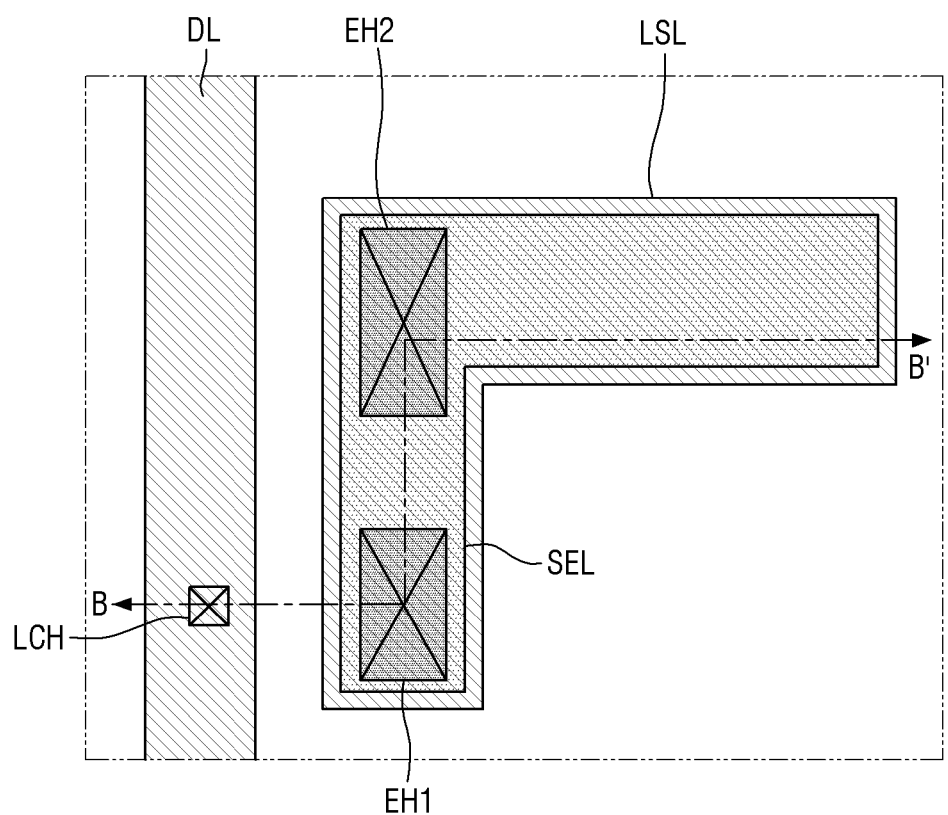
Figure 18:
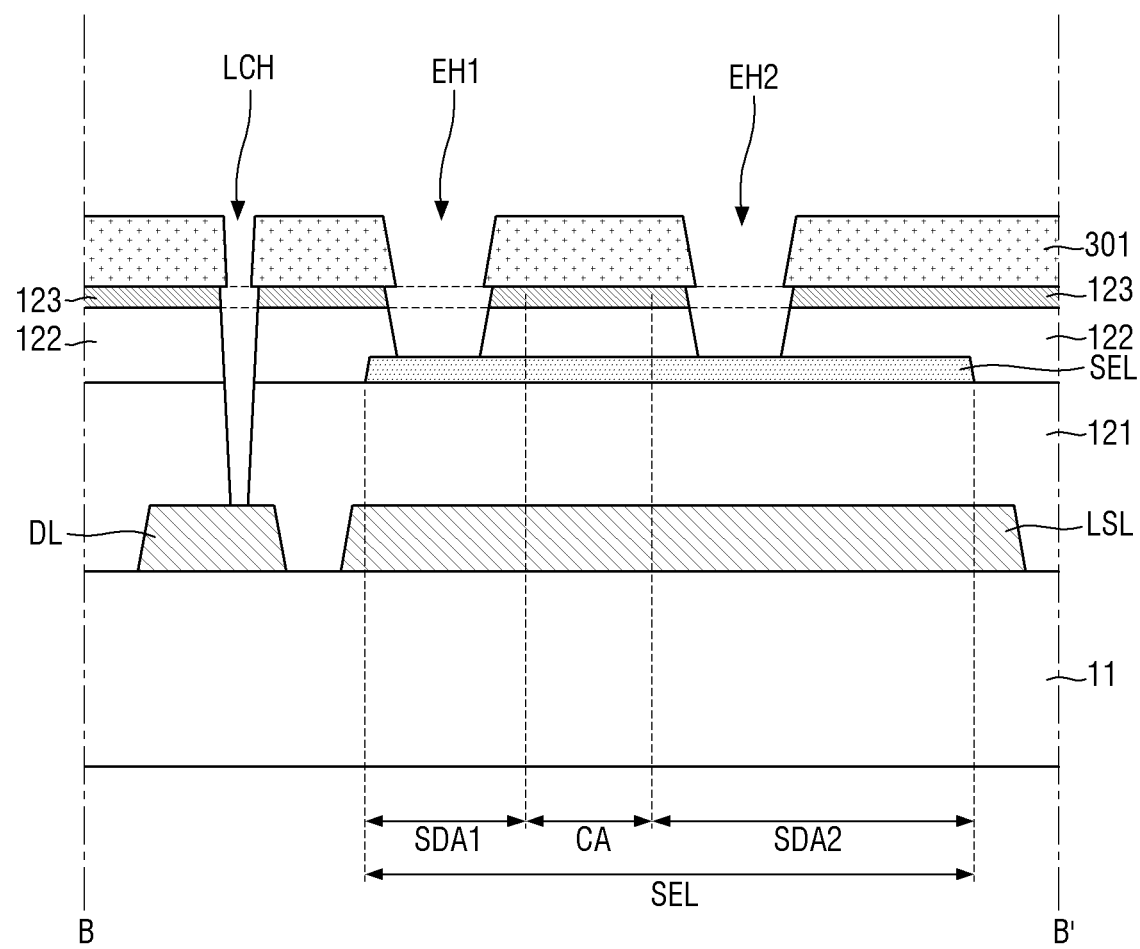

Referring to FIGS. 17 and 18, the step S70 of disposing the first electrode hole EH1 and the second electrode hole EH2 by patterning the gate insulating layer 122 and the diffusion barrier layer 123 may be performed.

The step S70 of disposing the first electrode hole EH1 and the second electrode hole EH2 may be a process of patterning the gate insulating layer 122 and the diffusion barrier layer 123 using a first patterning mask 301 is disposed on the diffusion barrier layer 123.

The first patterning mask 301 may be made of a photoresist material, and may include openings corresponding to a portion of each of the first electrode area SDA1 and the second electrode area SDA2 of the semiconductor layer SEL. Therefore, the diffusion barrier layer 123 and the gate insulating layer 122, which are exposed to the etching material through the openings of the first patterning mask 301, may be removed, providing the first electrode hole EH1 and the second electrode hole EH2.

The first electrode hole EH1 may pass through the gate insulating layer 122 and the diffusion barrier layer 123 and may correspond to a portion of the first electrode area SDA1 of the semiconductor layer SEL. A portion of the first electrode area SDA1 of the semiconductor layer SEL may be exposed by the first electrode hole EH1.

A portion of the first electrode area SDA1 of the semiconductor layer SEL, which corresponds to the first electrode hole EH1, may be exposed to the etching material for patterning the gate insulating layer 122 and the diffusion barrier layer 123. A portion of the first electrode area SDA1 of the semiconductor layer SEL, which may correspond to the first electrode hole EH1, may be conductorized by injection of the doping material included in the etching material.

The second electrode hole EH2 may pass through the gate insulating layer 122 and the diffusion barrier layer 123 and may correspond to a portion of the second electrode area SDA2 of the semiconductor layer SEL. As a result, a portion of the second electrode area SDA2 of the semiconductor layer SEL may be exposed by the second electrode hole EH2.

A portion of the second electrode area SDA2 of the semiconductor layer SEL, which corresponds to the second electrode hole EH2, may be exposed to the etching material for patterning the gate insulating layer 122 and the diffusion barrier layer 123. A portion of the second electrode area SDA2 of the semiconductor layer SEL, which may correspond to the second electrode hole EH2, may be conductorized by injection of the doping material included in the etching material.

In the step S70 of deposing the first electrode hole EH1 and the second electrode hole EH2, the buffer layer 121 as well as the gate insulating layer 122 and the diffusion barrier layer 123 may be further patterned to further dispose a line contact hole LCH corresponding to a portion of the data line DL. The first patterning mask 301 may further include an opening corresponding to a portion of the data line DL. The etching process in the step S70 of disposing the first electrode hole EH1 and the second electrode hole EH2 may be performed until the patterning of the buffer layer 121 is completed.

The step S70 of deposing the first electrode hole EH1 and the second electrode hole EH2 may be performed in a state that the diffusion barrier layer 123 is interposed in a portion of the semiconductor layer SEL, which does not correspond to the opening of the first patterning mask 301 between the channel area CA of the semiconductor layer SEL and the first patterning mask 301. Therefore, the doping material included in the mask material constituting the first patterning mask 301 or the etching material for patterning the gate insulating layer 122 and the diffusion barrier layer 123 may be shielded by the diffusion barrier layer 123 from being injected into the channel area CA of the semiconductor layer SEL.

As described above, due to the arrangement of the diffusion barrier layer 123, the doping material may be prevented from being injected into the channel area CA of the semiconductor layer SEL during the step S70 of disposing the first electrode hole EH1 and the second electrode hole EH2. As a result, the semiconductor characteristics of the channel area CA of the semiconductor layer SEL may be maintained.

Figure 19:
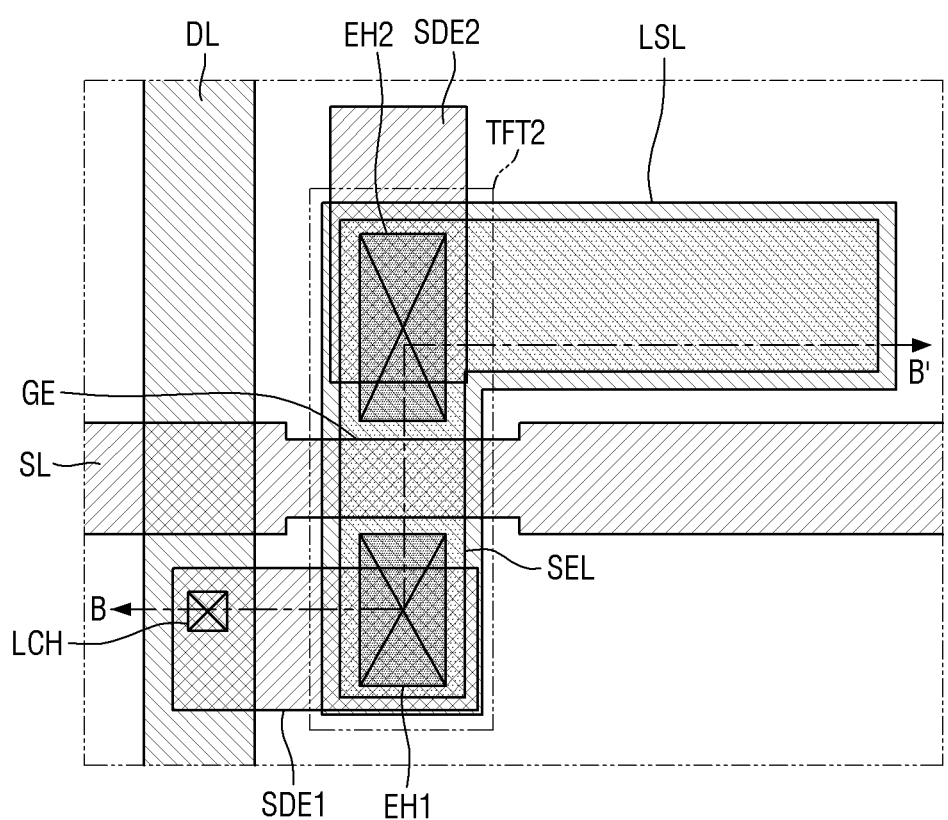
Figure 20:
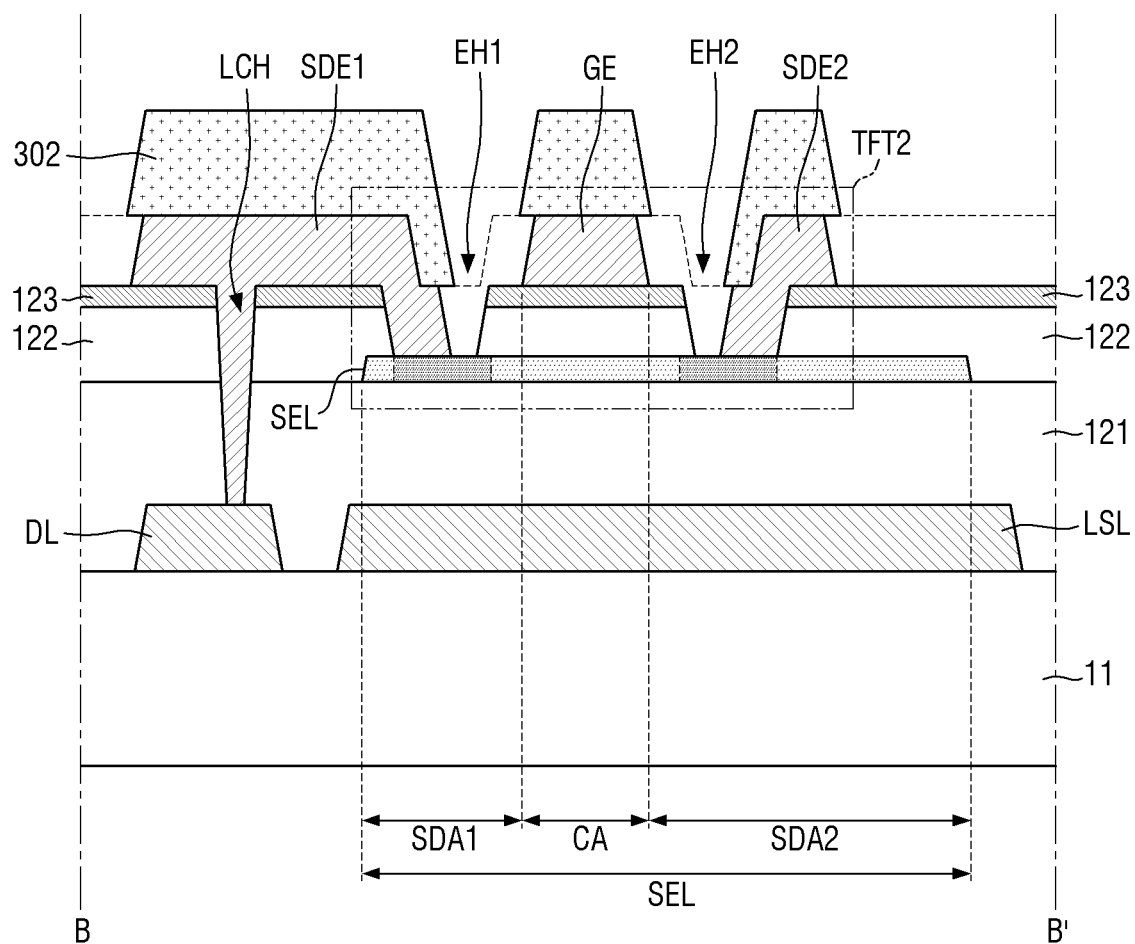

Referring to FIGS. 19 and 20, the step S80 of disposing the gate electrode GE, the first electrode SDE1 and the second electrode SDE2 on the diffusion barrier layer 123 may be performed.

The step S80 of deposing the gate electrode GE, the first electrode SDE1 and the second electrode SDE2 may be performed by disposing a conductive material layer on the diffusion barrier layer 123, disposing a second patterning mask 302 on the conductive material layer and then patterning the conductive material layer on the diffusion barrier layer 123 based on the second patterning mask 302.

The gate electrode GE overlaps the channel area CA of the semiconductor layer SEL.

The first electrode SDE1 is spaced apart from the gate electrode GE and disposed to cover at least a portion of the first electrode hole EH1. The first electrode SDE1 may be electrically connected to the first electrode area SDA1 of the semiconductor layer SEL through the first electrode hole EH1.

The first electrode SDE1 of the second thin film transistor TFT2 may be formed to connect the first electrode area SDA1 of the semiconductor layer SEL with the data line DL. The first electrode SDE1 of the second thin film transistor TFT2 may be electrically connected to the data line DL through the line contact hole LCH.

The second electrode SDE2 may be spaced apart from each of the gate electrode GE and the first electrode SDE1 and disposed to cover at least a portion of the second electrode hole EH2. The second electrode SDE2 may be electrically connected to the second electrode area SDA2 of the semiconductor layer SEL through the second electrode hole EH2.

When the gate electrode GE is formed of a portion of the scan line SL, the scan line SL intersecting the data line DL may be further disposed in the step S80 of disposing the gate electrode GE, the first electrode SDE1 and the second electrode SDE2.

Figure 21:
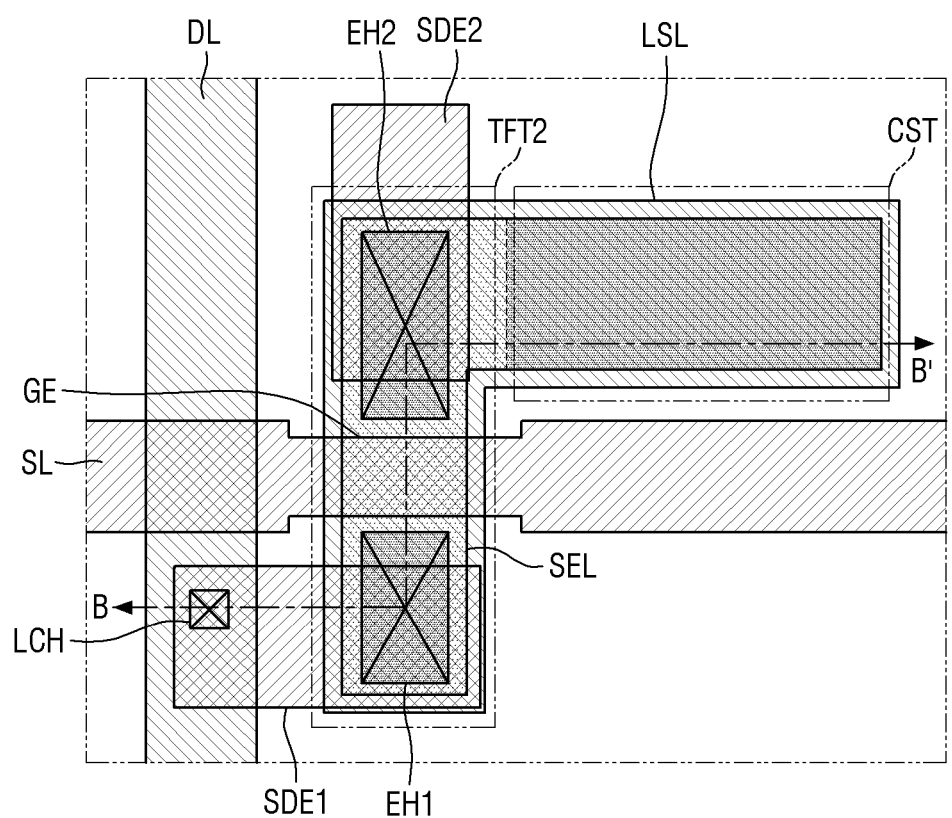
Figure 22:
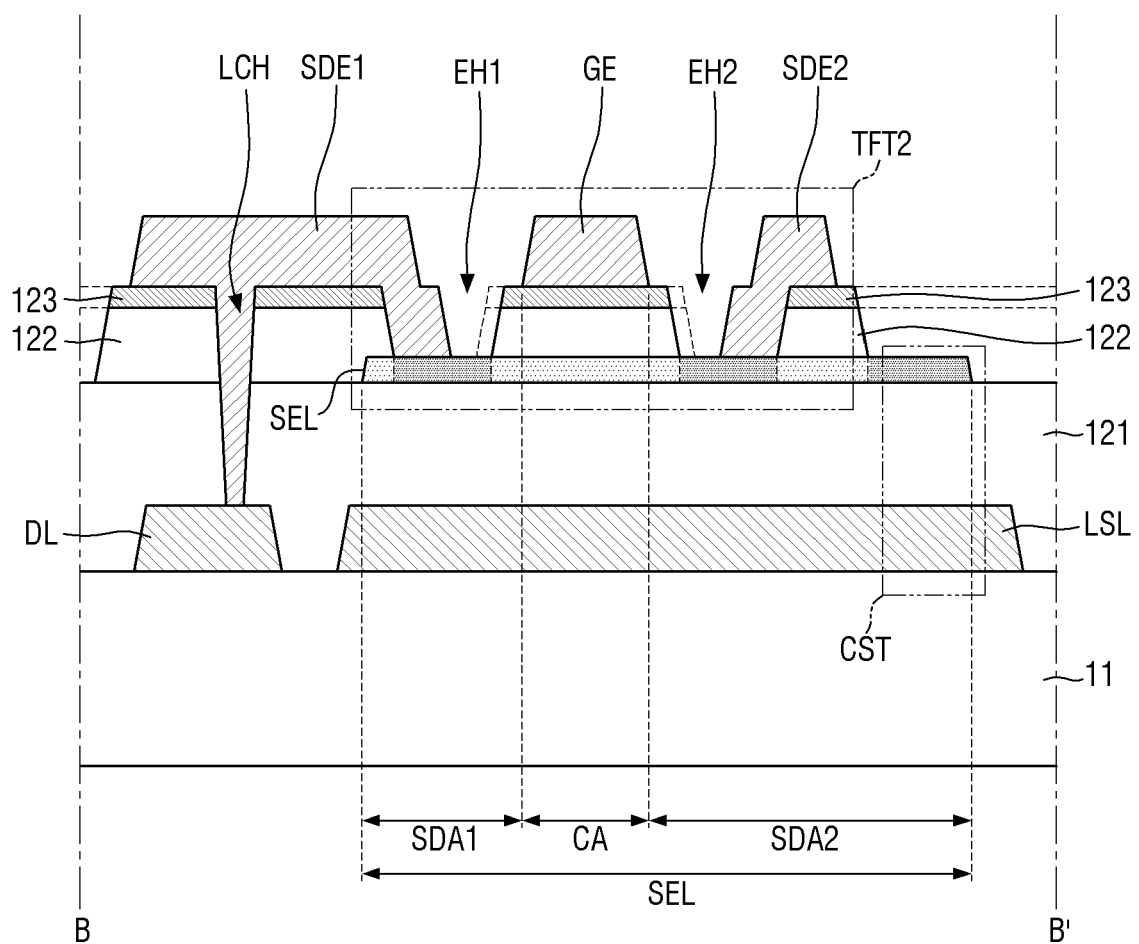

Referring to FIGS. 21 and 22, the step S90 of additionally patterning the gate insulating layer 122 and the diffusion barrier layer 123 based on the gate electrode GE, the first electrode SDE1 and the second electrode SDE2 may be performed.

At this time, a portion of the gate insulating layer 122 and the diffusion barrier layer 123, which is not covered with the gate electrode GE, the first electrode SDE1 and the second electrode SDE2, is removed. Therefore, a portion of the semiconductor layer SEL and the buffer layer 121, which may not overlap the gate electrode GE, the first electrode SDE1 and the second electrode SDE2, may be exposed.

The remainder, excluding the portion of the semiconductor layer SEL, which overlaps the gate electrode GE, the first electrode SDE1 and the second electrode SDE2, may be exposed to the etching material and conductorized.

As a result, not only a portion of the first electrode area SDA1 and the second electrode area SDA2 of the semiconductor layer SEL, which corresponds to the first electrode hole EH1 and the second electrode hole EH2, but also a portion of the first electrode area SDA1 and the second electrode area SDA2 of the semiconductor layer SEL, which does not correspond to the first electrode hole EH1 and the second electrode hole EH2, may be conductorized. As the conductorized portion of the first electrode area SDA1 and the second electrode area SDA2 of the semiconductor layer SEL is widened, a response speed of the thin film transistor may be improved.

When a storage capacitor CST is provided by an overlap area between the light shielding layer LSL and the second electrode area SDA2 of the semiconductor layer SEL, a portion of the second electrode area SDA2 of the semiconductor layer SEL, which may overlap, in a plan view, the light shielding layer LSL without overlapping the second electrode SDE2, may be conductorized. Therefore, the capacity of the storage capacitor CST may increase.

Figure 23:
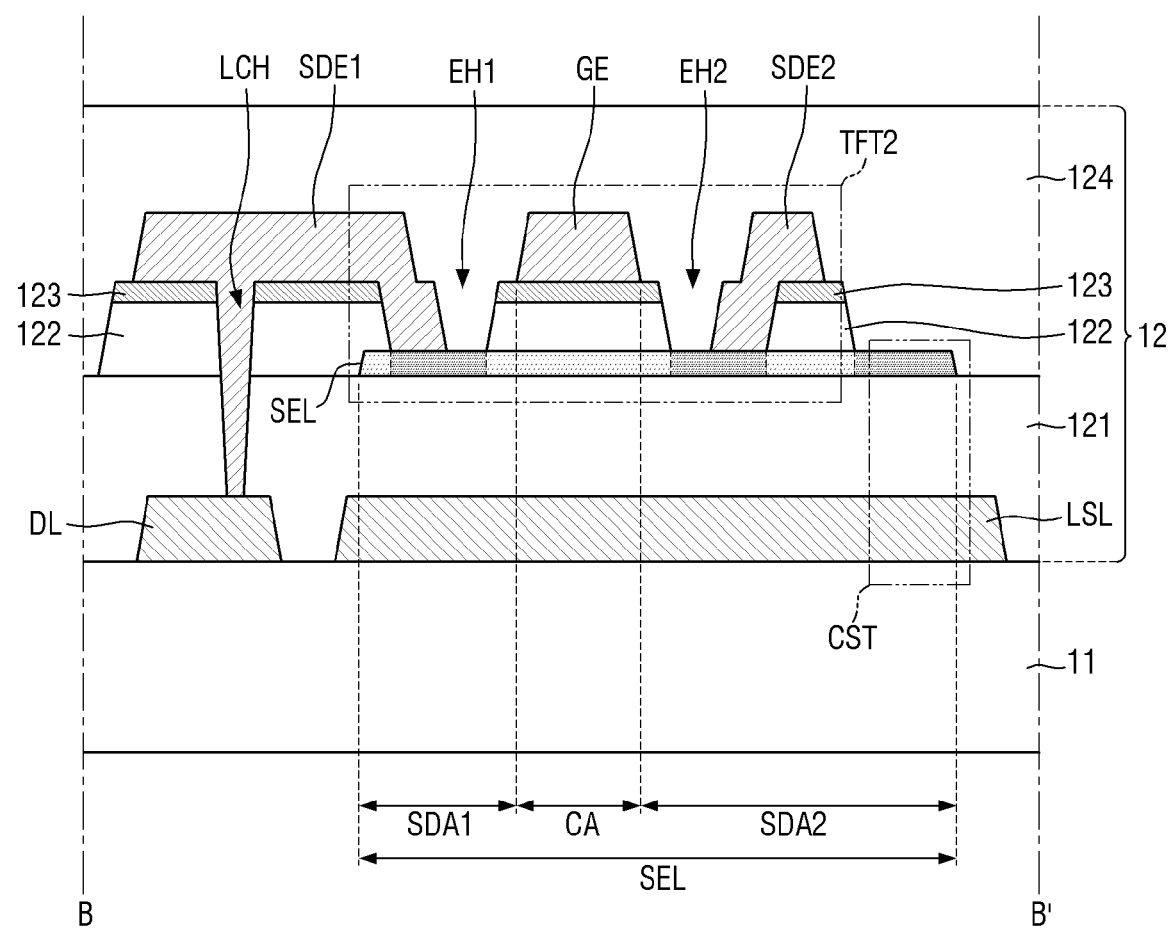

Referring to FIG. 23, a step (not shown) of disposing an interlayer insulating film 124 covering the gate electrode GE, the first electrode SDE1 and the second electrode SDE2 on the buffer layer 121 may be further performed.

At this time, since portions of the semiconductor layer SEL and the buffer layer 121, which is does not overlap the gate electrode GE, the first electrode SDE1 and the second electrode SDE2, may be exposed, the interlayer insulating layer 124 may contact the exposed semiconductor layer SEL and the exposed buffer layer 121.

The interlayer insulating layer 124 may be made of an inorganic insulating material such as silicon oxide, silicon nitride, silicon oxynitride, hafnium oxide, aluminum oxide, titanium oxide, tantalum oxide, and zinc oxide.

In other examples, the interlayer insulating layer 124 may be made of an organic insulating material such as an acrylic resin (polyacrylates resin), an epoxy resin, a phenolic resin, a polyamides resin, a polyimides resin, an unsaturated polyesters resin, a poly phenylenethers resin, a polyphenylenesulfides resin, or benzocyclobutene (BCB).

In other examples, the interlayer insulating layer 124 may be made of a stacked structure of multiple layers of different insulating materials.

As a result, the second thin film transistor TFT2 may be provided, which may include the light shielding layer LSL on the substrate 11, the semiconductor layer SEL on the buffer layer 121, the gate insulating layer 122 and the diffusion barrier layer 123, which cover the semiconductor layer SEL, and the gate electrode GE, the first electrode SDE1 and the second electrode SDE2 on the diffusion barrier layer 123.

The storage capacitor CST may be provided by overlapping the semiconductor layer SEL and the light shielding layer LSL in a plan view.

As described above, according to an embodiment, before the step S70 of disposing the first electrode hole EH1 and the second electrode hole EH2, the step S60 of disposing the diffusion barrier layer 123 on the gate insulating layer 122 may be performed.

Therefore, in the step S70 of disposing the first electrode hole EH1 and the second electrode hole EH2, even though the first patterning mask 301 may overlap the channel area CA of the semiconductor layer SEL, the diffusion barrier layer 123 interposed between the channel area CA of the semiconductor layer SEL and the first patterning mask 301 may prevent the doping material of the first patterning mask 301 from being injected into the channel area CA of the semiconductor layer SEL. The semiconductor characteristics of the channel area CA of the semiconductor layer SEL may be maintained.

Therefore, the thin film transistor may maintain a switching function where it is turned on and off based on the threshold voltage, and may prevent the uniformity of the threshold voltage characteristics of the thin film transistors of the pixel areas PX from deteriorating.

Since the diffusion barrier layer 123 may prevent the semiconductor layer SEL from being unnecessarily conductorized, the etching material, the insulating material and the mask material, which are used in the processes subsequent to step S60 of disposing the diffusion barrier layer 123 may be selected regardless of whether they may include doping materials. The wider selection may help prevent deteriorating the fabricating process efficiency.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A method for fabricating a thin film transistor, the method comprising:
   disposing a semiconductor layer including a channel area, a first electrode area, and a second electrode area, the first electrode area and the second electrode area contacting both sides of the channel area;
   disposing a gate insulating layer covering the semiconductor layer;
   disposing a diffusion barrier layer covering the gate insulating layer;
   disposing a first electrode hole corresponding to a portion of the first electrode area of the semiconductor layer and a second electrode hole corresponding to a portion of the second electrode area of the semiconductor layer, the disposing of the first electrode hole and the second electrode hole including patterning the diffusion barrier layer and the gate insulating layer with a patterning mask disposed on the diffusion barrier layer; and
   disposing a gate electrode overlapping the channel area of the semiconductor layer, in a plan view, a first electrode electrically connected to the first electrode area of the semiconductor layer through the first electrode hole, and a second electrode electrically connected to the second electrode area of the semiconductor layer through the second electrode hole, the disposing of the gate electrode, the first electrode, and the second electrode including:
      disposing a conductive material layer covering the diffusion barrier layer; and
      patterning the conductive material layer.

2. The method of claim 1, wherein, the semiconductor layer is made of an oxide semiconductor.

3. The method of claim 2, wherein the diffusion barrier layer is made of titanium (Ti).

4. The method of claim 2, wherein,
   the patterning of the diffusion barrier layer and the gate insulating layer uses an etching material that includes a doping material, and
   the disposing of the first electrode hole and the second electrode hole includes:
      conductorizing a portion of the first electrode area of the semiconductor layer,
      which is exposed by the first electrode hole using the doping material of the etching material; and
      conductorizing a portion of the second electrode area of the semiconductor layer,
      which is exposed by the second electrode hole, using the doping material of the etching material.

5. The method of claim 4, wherein, the disposing of the first electrode hole and of the second electrode hole includes:
   shielding with the diffusion barrier layer a remainder of the semiconductor layer from a doping material included in a mask material comprising the patterning mask, and
   the remainder of the semiconductor layer being a portion of the semiconductor layer that excludes the portion of the first electrode area corresponding to the first electrode hole, and the portion of the second electrode area corresponding to the second electrode hole.

6. The method of claim 2, further comprising:
   annealing to reduce a concentration of hydrogen (H) in the semiconductor layer and the gate insulating layer after the disposing of the gate insulating layer.

7. The method of claim 6, wherein, the annealing to reduce the concentration of hydrogen is performed at a temperature in a range of about 300° C. to about 350° C.

8. The method of claim 2, further comprising:
patterning the diffusion barrier layer and the gate insulating layer based on the gate electrode, the first electrode and the second electrode using an etching material, the patterning of the diffusion barrier layer and the gate insulating layer including:
conductorizing a remainder of the semiconductor layer using a doping material included in the etching material,
wherein the remainder of the semiconductor layer excludes a portion of the semiconductor layer that overlaps the gate electrode, the first electrode and the second electrode in a plan view.

9. The method of claim 2, further comprising:
disposing a light shielding layer on a substrate; and
disposing a buffer layer covering the light shielding layer, wherein,
in the disposing of the semiconductor layer, the semiconductor layer is disposed on the buffer layer, and
the channel area of the semiconductor layer overlaps the light shielding layer in a plan view.

10. The method of claim 1, wherein, in the disposing of the conductive material layer, the conductive material layer is provided as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

11. A method for fabricating a thin film transistor array substrate, the method comprising:
disposing a light shielding layer on a substrate, the light shielding layer corresponding to pixel areas of a substrate;
disposing a buffer layer covering the light shielding layer on the substrate;
disposing a semiconductor layer on the buffer layer, the semiconductor layer corresponding to the pixel areas, the semiconductor layer including a channel area, a first electrode area, and a second electrode area, the first electrode area and the second electrode area contacting both sides of the channel area;
disposing a gate insulating layer covering the semiconductor layer on the buffer layer;
disposing a diffusion barrier layer covering the gate insulating layer;
disposing a first electrode hole corresponding to a portion of the first electrode area of the semiconductor layer and a second electrode hole corresponding to a portion of the second electrode area of the semiconductor layer, the disposing of the first electrode hole and the second electrode hole including:
patterning the diffusion barrier layer and the gate insulating layer with a patterning mask disposed on the diffusion barrier layer; and
disposing a gate electrode overlapping the channel area of the semiconductor layer, in a plan view, a first electrode electrically connected to the first electrode area of the semiconductor layer through the first electrode hole, and a second electrode electrically connected to the second electrode area of the semiconductor layer through the second electrode hole, the disposing of the gate electrode, the first electrode, and the second electrode including:
disposing a conductive material layer covering the diffusion barrier layer; and
patterning the conductive material layer.

12. The method of claim 11, wherein, the semiconductor layer is made of an oxide semiconductor.

13. The method of claim 12, wherein, the diffusion barrier layer is made of titanium (Ti).

14. The method of claim 12, wherein
the disposing of the light shielding layer includes disposing a data line on the substrate,
the buffer layer covers the data line, and
the disposing of the first electrode hole and the second electrode hole includes patterning the buffer layer to dispose a line contact hole corresponding to a portion of the data line.

15. The method of claim 14, wherein, the disposing of the gate electrode, the first electrode and the second electrode includes:
disposing a scan line that intersects the data line on the diffusion barrier layer,
the gate electrode is comprised of a portion of the scan line, and
the first electrode is electrically connected to the data line through the line contact hole.

16. The method of claim 12, wherein,
the patterning of the diffusion barrier layer and the gate insulating layer uses an etching material that includes a doping material, and
the disposing of the first electrode hole and the second electrode hole includes:
conductorizing a portion of the first electrode area of the semiconductor layer,
which is exposed by the first electrode hole using doping material of the etching material; and
conductorizing a portion of the second electrode area of the semiconductor layer,
which is exposed by the second electrode hole using doping material of the etching material.

17. The method of claim 16, wherein, the disposing of the first electrode hole and of the second electrode hole includes
shielding with the diffusion layer a remainder of the semiconductor layer from a doping material included in a mask material comprising the patterning mask, and
the remainder of the semiconductor layer is a portion of the semiconductor layer that excludes the portion of the first electrode area corresponding to the first electrode hole, and the portion of the second electrode area corresponding to the second electrode hole.

18. The method of claim 12, further comprising:
annealing to reduce a concentration of hydrogen (H) in the semiconductor layer and the gate insulating layer after the disposing of the gate insulating layer.

19. The method of claim 18, wherein the annealing to reduce the concentration of hydrogen is performed at a temperature in a range of about 300° C. to about 350° C.

20. The method of claim 12, further comprising:
patterning the diffusion barrier layer and the gate insulating layer based on the gate electrode, the first electrode and the second electrode using an etching material,
the patterning of the diffusion barrier layer and the gate insulating layer including conductorizing a remainder of the semiconductor layer using a doping material included in the etching material,
wherein the remainder of the semiconductor layer excludes a portion of the semiconductor layer that overlaps the gate electrode, the first electrode and the second electrode in a plan view.

21. The method of claim 20, wherein the patterning of the diffusion barrier layer and the gate insulating layer includes conductorizing a portion of the second electrode area of the semiconductor layer which overlaps the light shielding layer in a plan view.

* * * * *